US008274142B2

(12) United States Patent
Denda

(10) Patent No.: US 8,274,142 B2
(45) Date of Patent: Sep. 25, 2012

(54) SEMICONDUCTOR DEVICE HAVING STACKED MULTIPLE SUBSTRATES AND METHOD FOR PRODUCING SAME

(75) Inventor: Atsushi Denda, Chino (JP)

(73) Assignee: Seiko Epson Corporation (JP)

( * ) Notice: Subject to any disclaimer, the term of this patent is extended or adjusted under 35 U.S.C. 154(b) by 344 days.

(21) Appl. No.: 12/615,449

(22) Filed: Nov. 10, 2009

(65) Prior Publication Data

US 2010/0117241 A1    May 13, 2010

(30) Foreign Application Priority Data

Nov. 11, 2008 (JP) ................. 2008-288861

(51) Int. Cl.
*H01L 23/02* (2006.01)
*H01L 29/40* (2006.01)
*H01L 21/00* (2006.01)
(52) U.S. Cl. .......................... 257/686; 257/777; 438/109
(58) Field of Classification Search .................. 257/686, 257/777; 438/109
See application file for complete search history.

(56) References Cited

U.S. PATENT DOCUMENTS

| 5,952,725 | A  | * | 9/1999  | Ball .............................. 257/777 |
| 6,188,126 | B1 | * | 2/2001  | Pedersen et al. ............. 257/685 |
| 6,359,340 | B1 | * | 3/2002  | Lin et al. ...................... 257/777 |
| 6,747,348 | B2 | * | 6/2004  | Jeung et al. .................. 257/686 |
| 6,798,071 | B2 | * | 9/2004  | Kawaishi ...................... 257/777 |
| 7,071,574 | B1 |   | 7/2006  | Nojiri et al. |
| 7,288,837 | B2 |   | 10/2007 | Nojiri et al. |
| 7,547,963 | B2 |   | 6/2009  | Nojiri et al. |
| 7,728,411 | B2 | * | 6/2010  | Lee et al. ...................... 257/666 |
| 7,932,162 | B2 | * | 4/2011  | Sagara et al. ................. 438/455 |
| 7,989,943 | B2 | * | 8/2011  | Kim et al. ..................... 257/686 |
| 2004/0227238 | A1 |  | 11/2004 | Hashimoto |
| 2005/0258539 | A1 | * | 11/2005 | Minda ........................... 257/738 |
| 2007/0176278 | A1 | * | 8/2007  | Wang ............................ 257/686 |
| 2008/0023848 | A1 |  | 1/2008  | Nojiri et al. |
| 2008/0303131 | A1 | * | 12/2008 | McElrea et al. ............. 257/686 |
| 2009/0051043 | A1 | * | 2/2009  | Wong et al. .................. 257/777 |
| 2009/0065948 | A1 | * | 3/2009  | Wang ............................ 257/777 |
| 2009/0134528 | A1 | * | 5/2009  | Lee et al. ...................... 257/777 |
| 2009/0166839 | A1 | * | 7/2009  | Suzuki et al. ................ 257/686 |

FOREIGN PATENT DOCUMENTS

| JP | 2001-094041 | 4/2001 |
| JP | 2001-196529 | 6/2001 |
| JP | 2001-291821 | 10/2001 |
| JP | 2004-281539 | 10/2004 |

* cited by examiner

*Primary Examiner* — James Mitchell
(74) *Attorney, Agent, or Firm* — Harness, Dickey & Pierce, P.L.C.

(57) ABSTRACT

A semiconductor device includes: a plurality of semiconductor substrates each having a pad-formed surface and being mutually laminated; a connection electrode pad formed on the pad-formed surface; a wire connecting the connection electrode pads of the plurality of semiconductor substrates so as to electrically connect the semiconductor substrates; a relay electrode pad that is provided on the pad-formed surface of a lower one of the laminated semiconductor substrates so as to be exposed by an upper one of the laminated semiconductor substrates, and that is connected to the connection electrode pad by a relay wire included in the wire; and a mounting electrode pad that is formed on a mounting surface on which the laminated semiconductor substrates are mounted, and that is connected to the relay electrode pad of the lower semiconductor substrate by the wire. In the device, the wire electrically connects the connection electrode pad of the upper semiconductor substrate to the relay electrode pad of the lower semiconductor substrate.

8 Claims, 9 Drawing Sheets

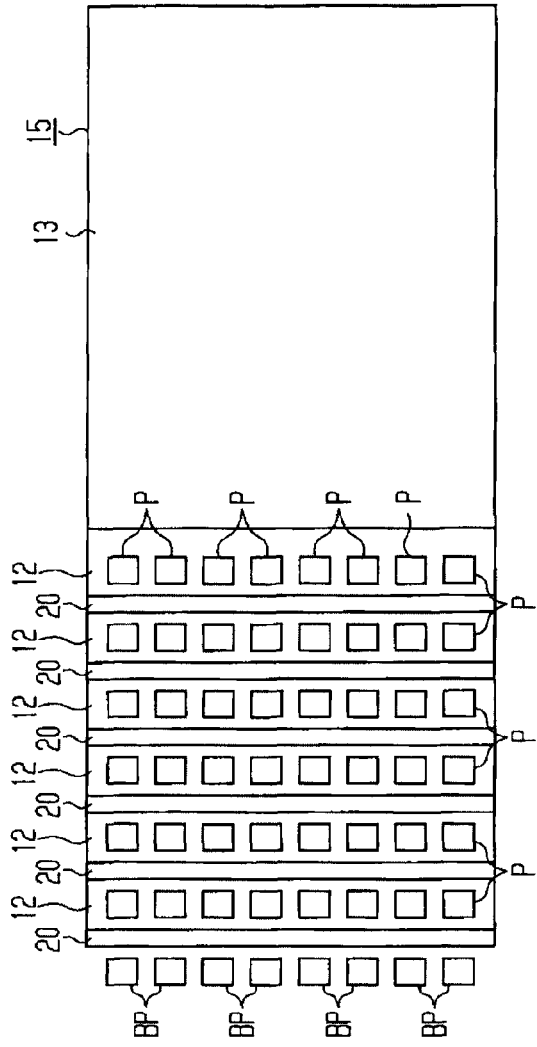
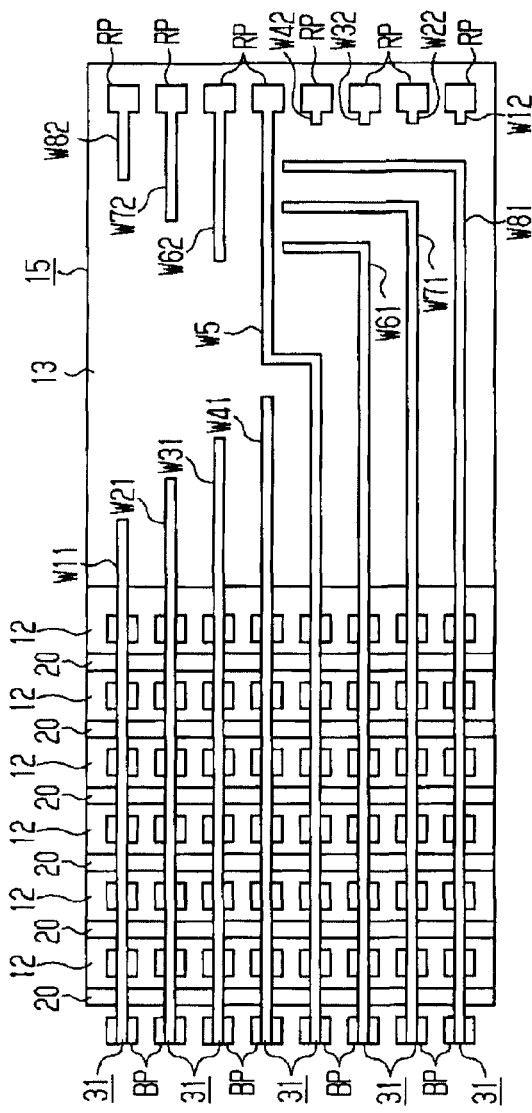
FIG. 6A
FIG. 6B

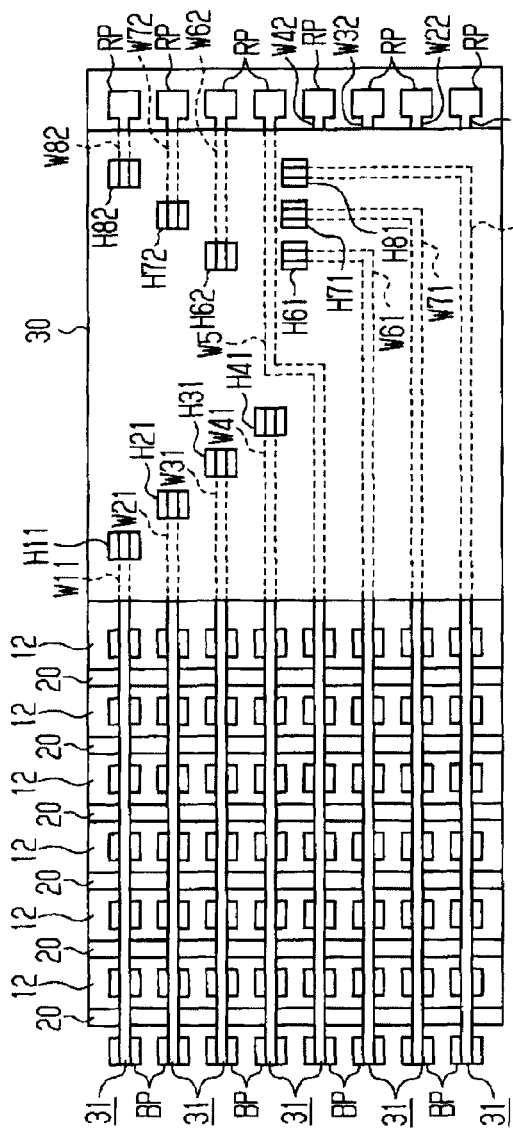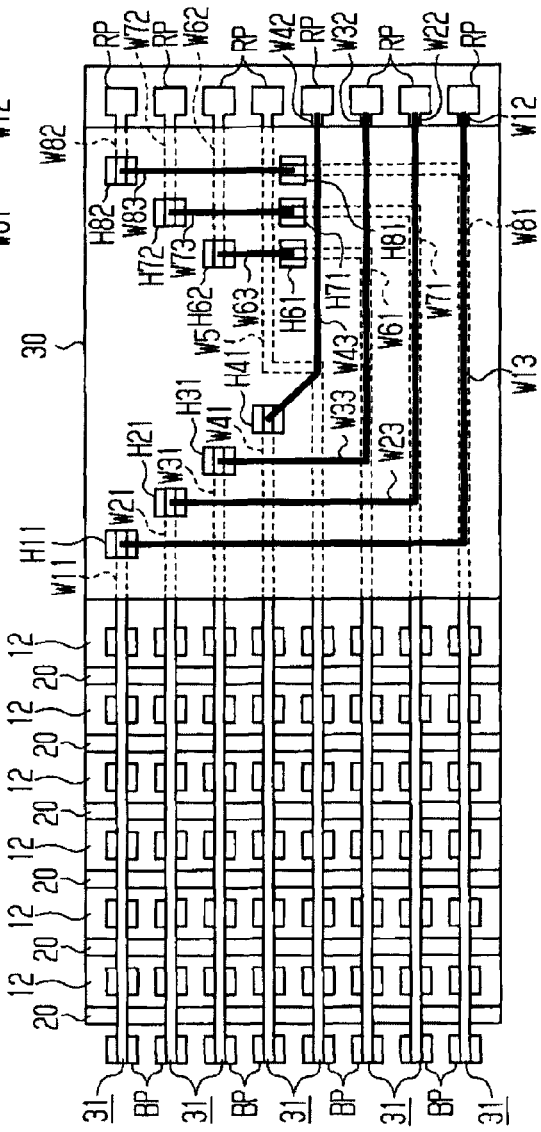
FIG. 7A
FIG. 7B

SEMICONDUCTOR DEVICE HAVING STACKED MULTIPLE SUBSTRATES AND METHOD FOR PRODUCING SAME

BACKGROUND

1. Technical Field

The present invention relates to a semiconductor device including a laminate of a plurality of semiconductor substrates connected by wires provided between the substrates and a method for producing the semiconductor device.

2. Related Art

In order to meet demands for miniaturization and weight reduction of electronic apparatuses, packaging technologies for semiconductor devices mounted in the electronic apparatuses employ a so-called surface-mounting method. In this method, semiconductor chips are mounted on a surface of a mounting substrate to reduce a size of the semiconductor devices. Among the technologies, in a chip scale packaging (CSP) technology, particularly in a wafer-level chip-scale packaging, a resin seal layer is directly formed on a surface of each semiconductor chip included in a wafer, and then, the semiconductor chips checked in that condition are cut out from the wafer and used in electronic apparatuses. Accordingly, a mounting area for a semiconductor device can be made equal to an area for the semiconductor chips, thereby obtaining a micro-miniature package.

Meanwhile, in the above-described semiconductor devices, higher performance is also demanded in addition to the demand for miniaturization. To satisfy those demands, JP-A-2004-281539 proposes a semiconductor device. The semiconductor device includes a plurality of semiconductor chips mounted in a single package to exhibit higher performance. Additionally, the semiconductor chips are mutually laminated by sandwiching an insulation layer and the like between the chips to reduce the size of the semiconductor device.

Along with the demands for further miniaturization and higher performance in semiconductor devices as described above, simplification of methods for producing semiconductor devices has also been demanded in recent years. FIG. 11 is a front view showing a front structure of a semiconductor device produced by an inkjet method as an example of the production method.

As shown in FIG. 11, on a mounting substrate 70 used for the semiconductor device, a plurality of semiconductor chips 71 having a same size are laminated in a stepped shape. Specifically, when viewed from an upper side as a normal direction of a mounting surface, the semiconductor chips 71 are sequentially laminated one on another in such a manner that upper semiconductor chips 71 avoid connection electrode pads P of lower semiconductor chips 71 and are deviated from the lower semiconductor chips 71 in a single direction on the mounting surface. Additionally, on the connection electrode pads P of each semiconductor chip 71, a linear wire 76 is laminated via an inclined portion 75 connecting the connection electrode pads P of the each semiconductor chip 71 to the substrate terminals BP of the mounting substrate 70.

In the lamination structure above, the connection electrode pads P of the each semiconductor chip 71 and the substrate terminals BP of the mounting substrate 70 can be arranged in the single direction when viewed from the upper side. Accordingly, in a process of producing the semiconductor device thus formed, liquid droplets of conductive ink are discharged in a manner so as to connect the connection electrode pads P to the substrate terminals BP, and then, the discharged ink is dried and fired. Thereby, the semiconductor device can be produced in the extremely simple process. Furthermore, connections between the respective semiconductor chips and the mounting substrate 70 can be formed by a metal film provided along an end face of each conductor chip. Thus, the semiconductor device can be further miniaturized as compared to semiconductor devices using wire bonding connections.

In the method described above, however, the connection electrode pads P of the each semiconductor chip 71 need to be arranged in the single direction when viewed from the upper side. Accordingly, arrangement positions of upper semiconductor chips 71 are more deviated in the single direction than in lower chips 71. Therefore, as a total number of the semiconductor chips 71 laminated is increased to satisfy the demand for higher performance, an area occupied by the laminated semiconductor chips 71 is extended in the single direction. As a result, the above method cannot be employed for electronic devices and apparatuses produced in standardized sizes, particularly, for electronic devices such as SD memory cards and micro SD memory cards.

Furthermore, when laminating the semiconductor chips, the upper semiconductor chips 71 may be laminated along the normal direction of the mounting surface, without being deviated in the planar direction of the mounting surface as described above. However, in the structure, the connection electrode pads P of the lower semiconductor chips 71 are covered by the upper semiconductor chips 71. Thus, it is necessary to form a wiring through-hole in each of the upper semiconductor chips 71, resulting that the production process becomes complicated, and furthermore, checking of the each semiconductor chips becomes difficult.

SUMMARY

An advantage of the invention is to provide a semiconductor device that allows reduction in an area occupied by a laminate of a plurality of semiconductor chips on a mounting surface. Another advantage of the invention is to provide a method for producing the semiconductor device.

A semiconductor device according to a first aspect of the invention includes a plurality of semiconductor substrates each having a pad-formed surface and being mutually laminated; a connection electrode pad formed on the pad-formed surface; a wire connecting the connection electrode pads of the plurality of semiconductor substrates so as to electrically connect the semiconductor substrates; a relay electrode pad that is provided on the pad-formed surface of a lower one of the laminated semiconductor substrates so as to be exposed by an upper one of the laminated semiconductor substrates, and that is connected to the connection electrode pad by a relay wire included in the wire; and a mounting electrode pad that is formed on a mounting surface on which the laminated semiconductor substrates are mounted, and that is connected to the relay electrode pad of the lower semiconductor substrate by the wire. In the device, the wire electrically connects the connection electrode pad of the upper semiconductor substrate to the relay electrode pad of the lower semiconductor substrate.

In the structure above, on the pad-formed surface of the lower semiconductor substrate, the relay electrode pad connected to the connection electrode pad is provided so as to be exposed by the upper semiconductor substrate. Then, the wire electrically connects the mounting electrode pad of the mounting substrate to the connection electrode pad of the lower semiconductor substrate and also electrically connects the connection electrode pad of the upper semiconductor substrate to the relay electrode pad of the lower semiconductor substrate. Accordingly, relative positions of the connection electrode pad of the upper semiconductor substrate and the mounting electrode pad of the mounting substrate are displaced in a planar direction of the mounting surface in accordance with relative positions of the connection electrode pad and the relay electrode pad on the lower semiconductor substrate. In other words, relative positions of the lower and the upper semiconductor substrates are displaced in the planar direction of the mounting surface in accordance with relative positions of the connection electrode pad and the relay electrode pad.

Thereby, in the semiconductor device described above, the semiconductor substrates are mutually laminated more flexibly. Thus, regardless of a structural restriction in which the connection electrode pads of the semiconductor substrates are connected by the wire, the upper semiconductor substrate can be displaced in the planar direction of the mounting surface, so that a size of the laminate of the semiconductor substrates can be reduced in the planar direction of the mounting surface. In this manner, the lamination structure of the semiconductor substrates can be changed. Thus, the semiconductor device of the aspect allows the plurality of semiconductor substrates to be mounted even on a mounting substrate where an area for the semiconductor substrates is limited due to standards or the like.

In the semiconductor device of the aspect, preferably, the semiconductor substrates include: (i) a first block that includes a plurality of first semiconductor substrates each having a pad-formed surface and a first connection electrode pad on the pad-formed surface, and a relay substrate having a connection electrode pad and the relay electrode pad connected to the connection electrode pad, and that forms a laminate of the plurality of first semiconductor substrates and the relay substrate in such a manner that the first connection electrode pad is exposed in a normal direction of the pad-formed surface, and the relay substrate is laminated as an uppermost substrate of the laminate, the connection electrode pad of the relay substrate and the first connection electrode pad being connected to the mounting electrode pad by a lower wire included in the wire; and (ii) a second block that includes a plurality of second semiconductor substrates each having a pad-formed surface and a second connection electrode pad on the pad-formed surface, and being mutually laminated in such a manner that the second connection electrode pad is exposed in a normal direction of the pad-formed surface, the second connection electrode pads of the second semiconductor substrates being mutually connected by an upper wire included in the wire. The second block is laminated on the first block in such a manner that a lowest one of the second semiconductor substrates covers the connection electrode pad of the relay substrate and exposes the relay electrode pad of the relay substrate, and the relay electrode pad is connected to the second connection electrode pad of the lowest semiconductor substrate by the upper wire.

In the above structure, the each laminate including the plurality of semiconductor substrates formed per block is laminated one on the other. Accordingly, for example, even in the lamination structure in which the lower wire of the first block is covered by the second block when viewed from the normal line of the mounting surface, mounting of the semiconductor substrates can be performed, thereby facilitating production of the semiconductor device of the aspect.

Preferably, the semiconductor device further including an insulating inclined portion having a continuous surface mutually connecting the pad-formed surfaces of the upper and the lower semiconductor substrates in a manner so as to reduce a stepped difference between the pad-formed surfaces, and the upper and the lower wires each being made of a metal film laminated on the continuous surface so as to connect the connection electrode pads of the upper and the lower semiconductor substrates.

In the above structure, the plurality of semiconductor substrates are mutually laminated in such a manner that the connection electrode pads are exposed, whereby there is formed the stepped difference between the upper pad-formed surface and the lower pad-formed surface. In the semiconductor device thus structured, the inclined portion reduces the stepped difference, as well as since the upper and the lower wires are formed on the inclined portion, mechanical stress acting on the wires is reduced even when the upper and the lower wires each are the metal film. Thus, forming the upper and the lower wires by the metal film allows a reduction in a thickness of the semiconductor device itself.

In the semiconductor device of the aspect, preferably, the relay wire is formed into a multilayered structure via an insulation layer.

In the above structure, the relay wire is formed into the multilayered structure via the insulation layer. Accordingly, even when a plurality of relay wires intersecting on the pad-formed surface are necessary, the relay wires are insulated by the insulation layer. Consequently, an arrangement of the relay electrode pad and a shape of the relay wire can be determined with higher flexibility, thereby increasing flexibility in the arrangement of the semiconductor substrate connected to the relay electrode pad. As a result, the lamination of the semiconductor substrates can be achieved in a more flexible manner.

According to a second aspect of the invention, there is provided a method for producing a semiconductor device in which a plurality of semiconductor substrates each having a pad-formed surface and a connection electrode pad on the pad-formed surface is electrically connected by a wire connecting the connection electrode pads of the plurality of semiconductor substrates so as to be mutually laminated. The method of the second aspect includes forming a relay electrode pad on the pad-formed surface of a lower one of the semiconductor substrates to connect the relay electrode pad to the connection electrode pad of the lower semiconductor substrate by a relay wire and then laminating an upper one of the semiconductor substrates on the lower semiconductor substrate in such a manner that the relay electrode pad is exposed by the upper semiconductor substrate; forming the wire so as to electrically connect a mounting electrode pad formed on a mounting surface for mounting the semiconductor substrates to the connection electrode pad of the lower semiconductor substrate; and forming the wire so as to connect the connection electrode pad of the upper semiconductor substrate to the relay electrode pad of the lower semiconductor substrate after laminating the upper semiconductor substrate on the lower semiconductor substrate.

In the above structure, on the pad-formed surface of the lower semiconductor substrate are formed the connection electrode pad and the relay electrode pad that are connected to each other. Then, upon lamination of the semiconductor substrates, the relay electrode pad is exposed by the upper semiconductor substrate to form the wire connecting the connection electrode pad of the upper semiconductor substrate to the relay electrode pad of the lower semiconductor substrate. Accordingly, in accordance with relative positions of the connection electrode pad and the relay electrode pad on the lower semiconductor substrate, relative positions of the connection electrode pad of the upper semiconductor substrate and the mounting electrode pad of the mounting substrate are displaced in the planar direction of the mounting surface. In other words, the relative positions of the lower and the upper semiconductor substrates are displaced in the planar direction of the mounting surface in accordance with the relative positions of the connection electrode pad and the relay electrode pad.

Thus, in the semiconductor device described above, the lamination manner of the semiconductor substrates is more flexible. Accordingly, although there is a structural restriction in which the connection electrode pads of the respective semiconductor chips are mutually connected by the wire, the upper semiconductor substrate can be displaced in the planar direction of the mounting surface, so that a size of the laminate including the semiconductor substrates can be reduced in the planar direction of the mounting surface. Consequently, since the manner of laminating the semiconductor substrates can be changed, the method of the second aspect allows a plurality of semiconductor substrates to be mounted even on a mounting substrate where an area occupied by the semiconductor substrates is limited due to standards or the like.

In the method of the second aspect, preferably, the semiconductor substrates include a plurality of first semiconductor substrates each having a pad-formed surface and a first connection electrode pad on the pad-formed surface, a relay substrate having a connection electrode pad and the relay electrode pad connected to the connection electrode pad, and a plurality of second semiconductor substrates each having a pad-formed surface and a second connection electrode pad on the pad-formed surface, and the lamination step further includes (i) forming a first block by laminating the first semiconductor substrates and the relay substrate in such a manner that the first connection electrode pad is exposed in a normal direction of the pad-formed surface of the first semiconductor substrate and the relay substrate is laminated as an uppermost substrate of the laminate and also by connecting the connection electrode pad of the relay substrate and the first connection electrode pads to the mounting electrode pad by a lower wire included in the wire; (ii) forming a second block by mutually laminating the second semiconductor substrates in such a manner that the second connection electrode pad is exposed in a normal direction of the pad-formed surface of the second semiconductor substrate and also by mutually connecting the second connection electrode pads by an upper wire included in the wire; and (iii) laminating the second block on the first block in such a manner that a lowest second semiconductor substrate in the second block covers the connection electrode pad of the relay substrate and exposes the relay electrode pad of the relay substrate and connecting the relay electrode pad to the second connection electrode pad of the lowest second semiconductor substrate by the upper wire.

In the method above, each laminate of the semiconductor substrates formed per block is mutually laminated. Accordingly, for example, even in the lamination structure in which the lower wire of the first block is covered by the second block when viewed from the normal direction of the mounting surface, mounting of the semiconductor substrates can be achieved, thereby facilitating production of the semiconductor device thus structured.

Preferably, in the method above, each of the upper and the lower wires mutually connecting the connection electrode pads is formed by forming an insulating inclined portion having a continuous surface mutually connecting the pad-formed surfaces of the upper and the lower semiconductor substrates in a manner so as to reduce a stepped difference between the upper and the lower pad-formed surfaces, discharging a conductive particle-containing liquid in a manner so as to mutually connect the upper and the lower connection electrode pads via the continuous surface, and then drying and firing the liquid.

In the method above, the plurality of semiconductor substrates are mutually laminated in the manner so as to expose the connection electrode pads, whereby the stepped difference is formed between the upper and the lower pad-formed surfaces. In this method, the upper and the lower wires are formed by using the liquid containing a pattern material. Accordingly, when forming the wires connecting portions with the stepped difference, no mechanical stress is applied to the semiconductor substrates. Thus, thinner semiconductor substrates can be used, thereby leading to a reduction in a thickness of the semiconductor device itself.

In the method of the second aspect, preferably, the relay wire is formed by discharging a conductive particle-containing liquid in a manner so as to connect the connection electrode pad to the relay electrode pad, and then drying and firing the liquid.

In the method above, the semiconductor substrates are mutually laminated in the manner so as to expose the connection electrode pads. Thus, for example, when the respective semiconductor substrates have a same size, the semiconductor substrates are laminated in a stepped shape, thereby forming a space below the upper substrates. In the method above, the relay wire can be formed without any mechanical stress from above applied to the semiconductor substrates below which the space is formed. Accordingly, even in the condition where the semiconductor substrate having the relay electrode pad is laminated, the relay wire can be formed, eventually allowing consecutive formation of the lower wire and the relay wire.

In the method of the second aspect, preferably, the relay wire is formed into a multilayered structure via an insulation layer.

In the method above, the relay wire is formed into the multilayered structure via the insulation layer. Accordingly, even when a plurality of relay wires intersecting on the pad-formed surface are necessary, the relay wires are insulated by the insulation layer. Consequently, an arrangement of the relay electrode pad and a shape of the relay wire can be determined with high flexibility, thereby increasing flexibility in the arrangement of the semiconductor substrate connected to the relay electrode pad. As a result, the semiconductor substrates can be mutually laminated in a more flexible manner.

Preferably, in the method above, the insulation layer is formed by discharging a liquid containing an insulation layer forming material on the pad-formed surface, and then drying the liquid.

In the method above, even after the relay wire is formed on the lower semiconductor substrate, the insulation layer can be formed without applying any stress on the semiconductor substrate. Thereby, the thickness of the semiconductor substrate can be further reduced, as well as the arrangement of the semiconductor substrate can be made more flexibly.

BRIEF DESCRIPTION OF THE DRAWINGS

The invention will be described with reference to the accompanying drawings, wherein like numbers reference like elements.

FIG. 6A is a plan view showing a condition in which there is fixed a first block including a plurality of semiconductor chips laminated on a mounting substrate in a stepped shape in a semiconductor device according to a second embodiment of the invention, FIG. 6B is a plan view showing wires formed on the first block of FIG. 6A in the semiconductor device of the second embodiment.

FIG. 7A is a plan view showing an insulation layer formed on the wires of the first block of FIG. 6B in the semiconductor device of the second embodiment.

FIG. 7B is a plan view showing wires formed on the insulation layer of FIG. 7A in the semiconductor device of the second embodiment.

DESCRIPTION OF EXEMPLARY EMBODIMENTS

Embodiments of the invention will be described.

First Embodiment

Figure 1:
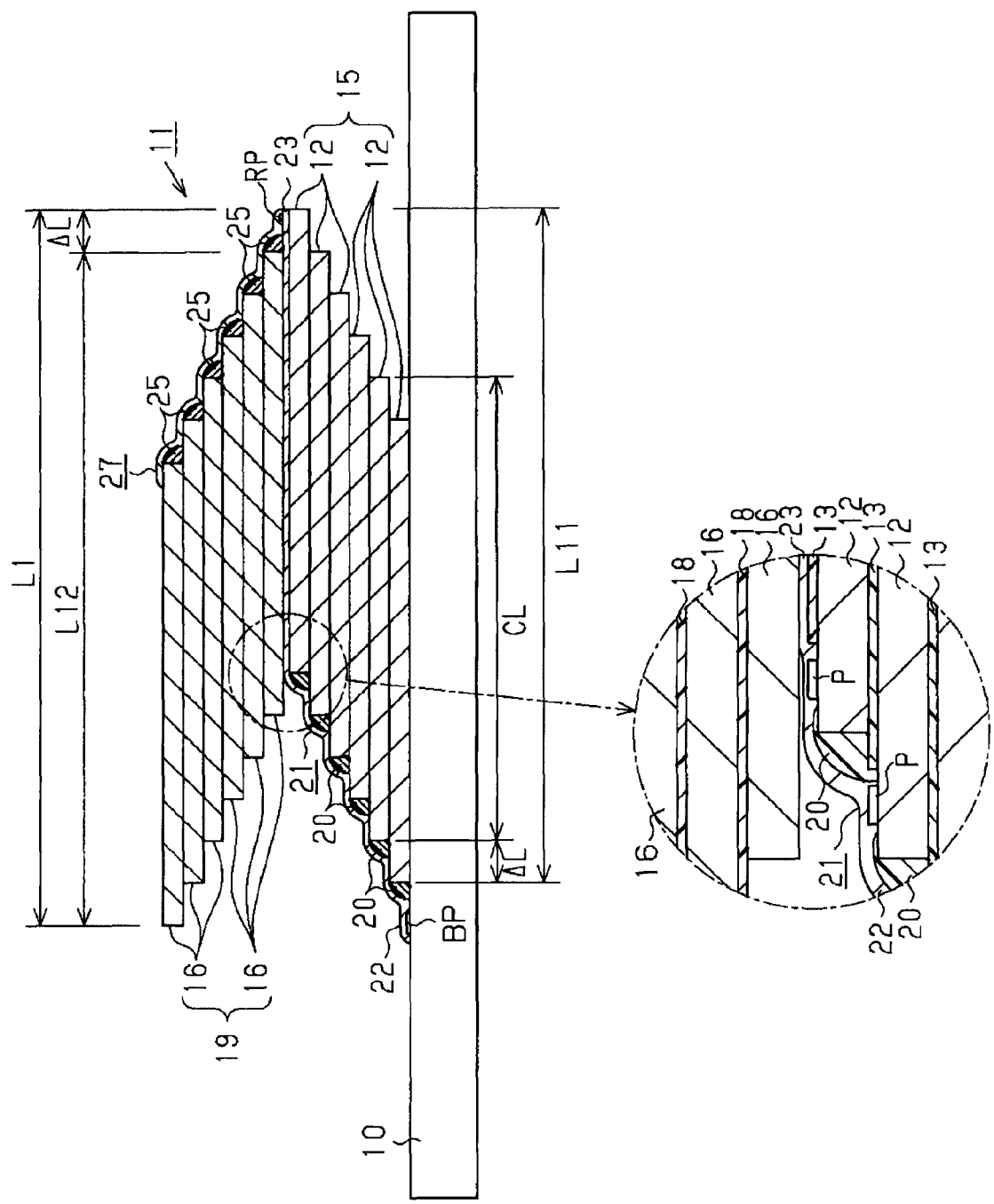
FIG. 1 is a sectional view from a front direction of a semiconductor device according to a first embodiment of the invention.
Figure 2A:
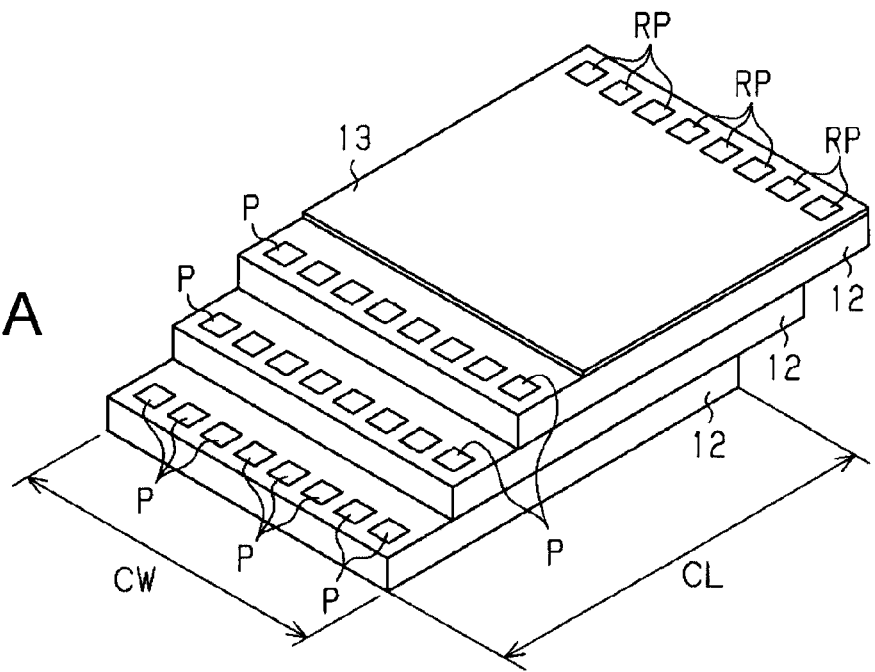
FIG. 2A is a perspective view showing a plurality of semiconductor chips laminated in a stepped shape in a single direction in the semiconductor device of the first embodiment.
Figure 2B:
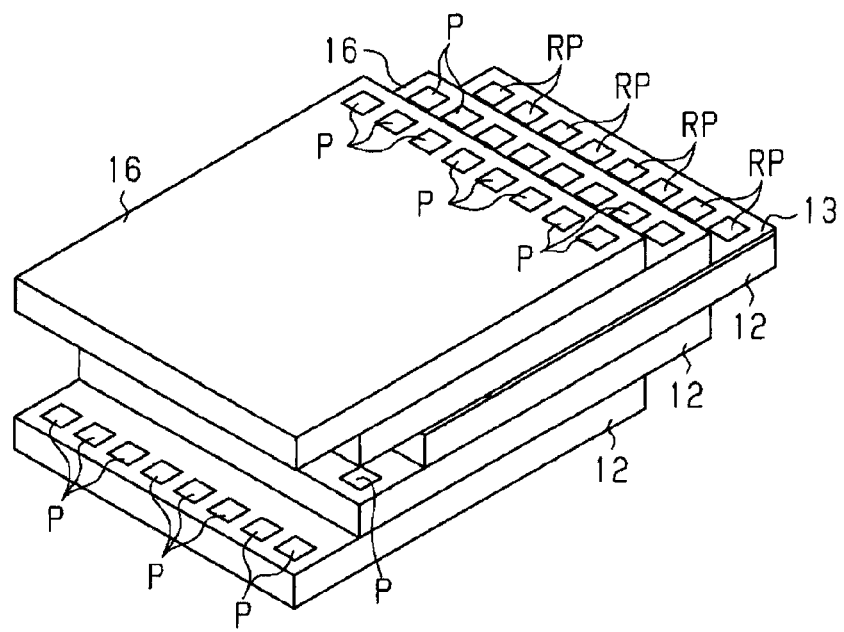
FIG. 2B is a perspective view showing a plurality of semiconductor chips laminated on the laminate of the semiconductor chips shown in FIG. 2A in a direction opposite to the single direction
Figure 3:
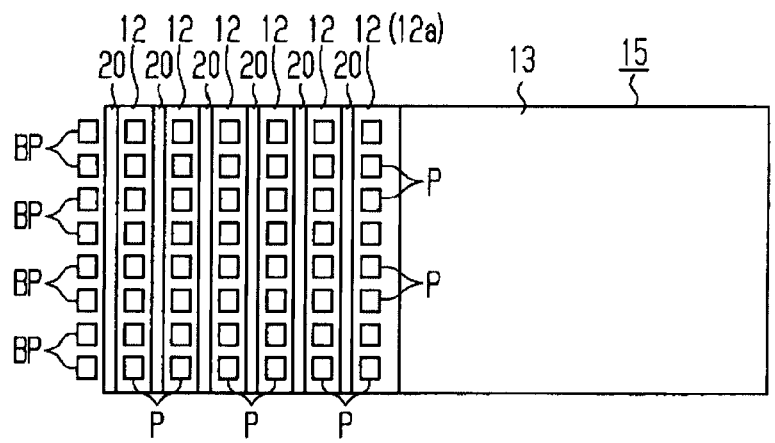
FIG. 3 is a perspective view showing a first block of the semiconductor device of the first embodiment.
Figure 4:
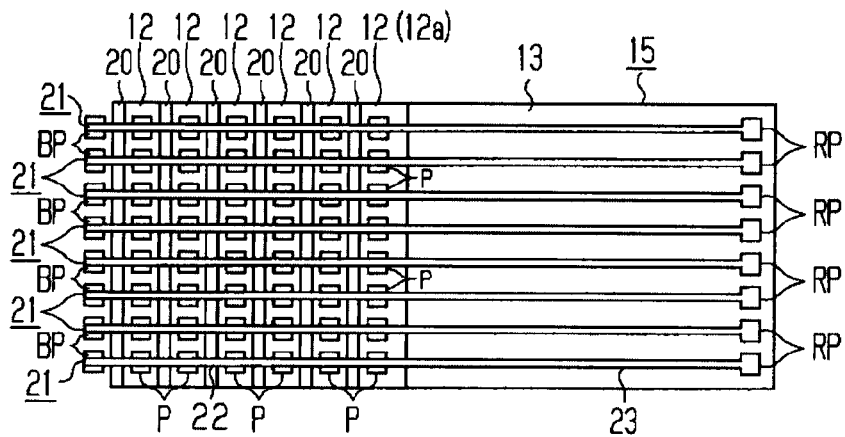
FIG. 4 is a plan view showing lower wires formed on the first block of the semiconductor device of the first embodiment.
Figure 5:
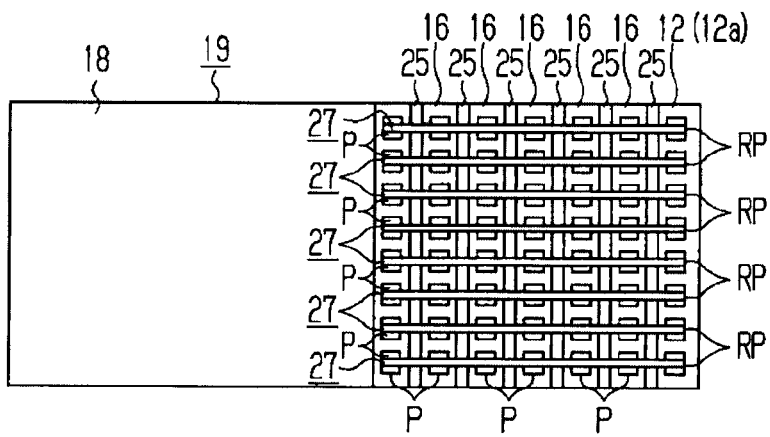
FIG. 5 is a plan view showing upper wires formed on a second block laminated on the first block of the semiconductor device of the first embodiment.

Hereinafter, a semiconductor device according to a first embodiment of the invention will be described with reference to FIGS. 1 to 5. FIG. 1 is a partial sectional view for illustrating a front sectional structure of the semiconductor device of the first embodiment. FIGS. 2A and 2B are perspective views showing partial perspective structures of the semiconductor device. In FIG. 2A, respective semiconductor chips as a plurality of semiconductor substrates are mutually laminated in such a manner that each of the semiconductor chips is deviated with respect to each lower chip in a single direction. In FIG. 2B, on a laminate corresponding to the structure of FIG. 2A, there are additionally laminated a plurality of semiconductor chips, each of which is deviated with respect to each lower chip in a direction opposite to the single direction. In addition, FIG. 3 shows a planar structure of a first block where each of the semiconductor chips is laminated so as to be deviated with respect to each lower chip in a single direction. FIG. 4 shows a planar structure of lower wires formed on the first block. FIG. 5 shows a planar structure of upper wires formed on a second block where each of the semiconductor chips is laminated so as to be deviated with respect to each lower chip in a direction opposite to the single direction.

As shown in FIG. 1, a chip laminate (a semiconductor device) 11 is fixed on a mounting substrate 10 provided for the semiconductor device. The chip laminate 11 includes a first block 15 as a laminate of six first semiconductor chips (first chips) 12 and a second block 19 as a laminate of six second semiconductor chips (second chips) 16 laminated on the first block 15.

The mounting substrate 10 is thin and flexible, namely a so-called flexible substrate. On a surface of the mounting substrate 10 are arranged electronic elements (not shown) such as resistances, capacitors, and inductances. The electronic elements or the like are connected by wires or the like formed on the surface so as to form predetermined circuits. The mounting substrate 10 may be made of a base material of a synthetic resin such as a polyimide resin, an epoxy resin, a polyester resin, a phenol resin, or a fluorine resin, a base material of paper or glass cloth, a composite base material as a combination of those base materials, or the like. Additionally, on the surface of the mounting substrate 10 are formed a plurality of substrate terminals BP as conductive mounting electrodes (See FIG. 3).

The substrate terminals BP are made of a conductive metal and are electrically connected to the electronic elements or the like on the mounting substrate 10 by wires. In the present embodiment, the substrate terminals BP are formed on the surface of the mounting substrate 10 by using an inkjet method. The inkjet method uses a conductive ink as a liquid including a dispersion containing conductive particles. The conductive particles serving as a pattern-forming material included in the conductive ink have a particle diameter of a few to a few tens of nanometers and may be made of a metal such as gold, silver, copper, platinum, palladium, rhodium, osmium, ruthenium, iridium, iron, tin, cobalt, nickel, chromium, tantalum, tungsten, or indium, or an alloy of them. It is only necessary to use a dispersion medium that evenly disperses the conductive particles. Examples of the dispersion medium include water, aqueous solutions mainly containing water, and organic compounds mainly containing organic solvents such as tetradecane. In the conductive ink of the embodiment, the included conductive particles are silver particles and the dispersion medium is water.

The chip laminate 11 is bondingly fixed to the surface of the mounting substrate 10 via a lowest first chip 12 positioned as a lowest layer of the first block 15 of the laminate 11 and faces the surface of the mounting substrate 10. In FIGS. 2A and 2B, each of the first chips 12 is a rectangular chip formed by using a base material made of a semiconductor material such as silicon wafer. The each first chip 12 has a longitudinal length of CL, a transverse length (width) of CW, and a vertical thickness of approximately 25 micrometers. On a surface of the first chip 12 are formed not-shown electronic circuits and the like including a memory element constructed by a plurality of transistors and the like. The first chip 12 of the present embodiment serves as a memory device, but may have other functions. In addition, the longitudinal length and the transverse width of the first chip 12 can be arbitrarily determined according to purposes of use, and the thickness of the first chip 12 is not restricted to the above value and may be larger or smaller than that. In FIGS. 2A and 2B, for convenience of description, there are not shown a part of the first chips 12 laminated and a part of the second chips 16 laminated.

On the surface of the first chip 12 are arranged a plurality of connection electrode pads P, which are electrodes formed by the inkjet method, similarly to the substrate terminals BP. The connection electrode pads P are provided in a single line along a side of a pad-formed surface as an upper surface of the first chip 12. The connection electrode pads P are connected to the electronic circuits formed on the first chip 12 to be assigned to each function of the electronic circuits. On the first chip 12, the connection electrode pads P are arranged in such a manner that an order of the each function corresponds to a predetermined order. Thereby, the electronic circuits on the first chip 12 are electrically connected to a circuit and the like on the mounting substrate 10 by an external wire or the like connected to each connection electrode pad P.

The pad-formed surface as the upper surface of the first chip 12 includes an insulation layer 13 on the electronic circuits. The insulation layer 13 protects the electronic circuits on the first chip 12 and allows electrical insulation between the electronic circuits and external conductive members. For example, the insulation layer 13 is made of one or a combination of at least two of insulating materials such as polymethyl methacrylate, polyvinyl phenol, polyimide, polystyrene, polyvinyl alcohol, or polyvinyl acetate. In the embodiment, the insulation layer 13 is formed in a manner so as to expose the connection electrode pads P, so that the insulation layer 13 does not inhibit connection between external wires and the connection electrode pads P, for example. Furthermore, also on a lower surface of the first chip 12 is formed an insulation film (not shown) same as the insulation layer 13 to allow insulation between the lower surface thereof and an external conductive member. In the embodiment, the insulation layer 13 on the upper surface and the insulation film on the lower surface of the first chip 12 are formed by the inkjet method using an insulating ink that includes any one of the above-mentioned insulating materials. Then, the first chips 12 are mutually laminated to form the first block 15.

As shown in FIG. 1, the six first chips 12 included in the first block 15 are laminated in such a manner that the side of the chips 12 adjacent to the electrode pads on the pad-formed surface is deviated by a predetermined deviation length ΔL in a back and forth direction (a lateral direction in FIG. 1) in such a manner that the connection electrode pads P of each chip are exposed upward. Thereby, the first chips 12 are mutually laminated in a stepped shape. In the first block 15, vertically adjacent two of the first chips 12 having the predetermined deviation length ΔL are bondingly fixed to each other by a not-shown bonding layer provided between the insulation layer 13 on the upper surface of the first chip 12 as a lower chip of the two chips and the insulation film on the lower surface of the first chip 12 as an upper chip thereof in a manner so as to expose the connection electrode pads P of each chip. Accordingly, for example, when each deviation length ΔL is set to 250 micrometers, the longitudinal length of the first block 15 including the six first chips 12 laminated is a first block length L11 obtained by adding the longitudinal length CL of a single first chip 12 to a total deviation length of 1250 (250×5) micrometers of remaining five first chips 12 that are mutually laminated while being deviated with respect to each other by the deviation length ΔL. Additionally, although the bonding layer in the embodiment has a thickness of 5 to 10 micrometers, the thickness of the bonding layer may alternatively be smaller than 5 micrometers or larger than 10 micrometers.

In the present embodiment, the first block 15 thus formed is bondingly fixed to the mounting substrate 10. Specifically, the bonding layer is formed between the lower surface of the first chip 12 as the lowest chip of the first block 15 and the surface of the mounting substrate 10 facing the lower surface of the lowest first chip 12. The lowest first chip 12 is bondingly fixed to the surface of the mounting substrate 10 via the bonding layer. Thereby, the first block 15 is bondingly fixed to the mounting substrate 10 via the lowest first chip 12 arranged on the mounting substrate 10 in such a manner that the connection electrode pads P of the lowest first chip 12 are arranged along the substrate terminals BP of the mounting substrate 10. On the mounting substrate 10, the first block 15 has the first block length L11 in a rightward direction with respect to the substrate terminals BP of the mounting substrate 10 in FIG. 1.

In FIGS. 1 and 3, the first block 15 has a stepped difference corresponding to the thickness of each first chip 12 at the side of the each first chip 12 having the connection electrode pads P. On the stepped portion is formed a slope 20 as an inclined portion.

The slope 20 has a continuous surface connecting the pad-formed surfaces of the pair of first chips 12 laminated one on the other so as to reduce a stepped difference between the pad-formed surfaces and is made of an insulating resin or the like, such as a polyimide resin, an epoxy resin, a polyester resin, a phenol resin, a fluorine resin, a UV-curable resin, or a visible light-curable resin. The slope 20 is formed at the side of the each first chip 12 having the connection electrode pads P. In this manner, a route connecting the connection electrode pads P of the lower first chip 12 to the connection electrode pads P of the upper first chip 12 is formed in a roughly non-stepped shape by the continuous surface.

Additionally, the slope 20 provided on the lowest first chip 12 has a continuous surface connecting a mounting surface of the mounting substrate 10 having the substrate terminals BP to the pad-formed surface of the lowest first chips 12 to reduce a stepped difference between the mounting surface thereof having the substrate terminals BP and the pad-formed surface of the lowest first chip 12. In this manner, a route connecting the respective substrate terminals BP on the mounting substrate 10 to the respective connection electrode pads P on the lowest first chip 12 is also formed in a roughly non-stepped shape by the continuous surface. In the embodiment, the slope 20 is formed by a dispenser method allowing accurate control of an amount and a position of a resin material discharged, after bondingly fixing the first block 15 on the mounting substrate 10.

In FIGS. 1 and 4, on the surface of the mounting substrate 10 and the surface of the first block 15 are provided a plurality of first wires 21 that are lower wires continuously extended in a lamination direction of the first chips 12. In order to form the first wires 21, using the inkjet method, a liquid droplet of the above-described conductive ink is discharged on the first block 15 bonded to the mounting surface in a manner so as to connect the respective substrate terminals BP to the respective connection electrode pads P of the first block 15, and then, the discharged conductive ink is dried and fired. The conductive ink of the embodiment contains the conductive particles of silver and water as the dispersion medium.

Specifically, the first wires 21 are divided into two parts according to formation positions of the first wires 21. Each of the first wires 21 includes a main wire 22 connecting the substrate terminal BP of the mounting substrate 10 to the connection electrode pad P of each first chip 12 corresponding to the terminal BP in the lamination direction of the first chips 12. Additionally, the each first wire 21 also includes a relay wire 23 extended from the connection electrode pad P in a longitudinal direction on the pad-formed surface of a connection chip 12a as an uppermost first chip 12 of the first block 15. A top end of each of the relay wires 23 is connected to a relay electrode pad RP integrally formed with the first wire 21 by the inkjet method.

The main wire 22 connects the each substrate terminal BP of the mounting substrate 10 to the connection electrode pad P of the lowest first chip 12 corresponding to the each substrate terminal BP and also connects the connection electrode pad P of the lowest first chip 12 to the connection electrode pad P of an upper first chip 12 corresponding to the pad P of the lowest first chip 12. Similarly, the main wire 22 connects connection electrode pads P corresponding to each other on a pair of first chips 12 positioned as upper and lower chips. The connection electrode pads P of the uppermost first chip 12 are connected to the corresponding connection electrode pads P of the lower first chip 12 positioned under the uppermost first chip 12. Thereby, the substrate terminals BP of the mounting substrate 10 are electrically connected to the corresponding connection electrode pads P on each first chip 12 in the lamination direction of the first chips 12. The main wires 22 are a metal film formed by the inkjet method and thus may become thinner or may be disconnected if there is any stepped difference at a point on the route. However, in the embodiment, the slope 20 is formed to roughly eliminate such a stepped difference vertically generated at the sides of the first chips 12 where the electrode pads are arranged. Thereby, occurrences of the above-mentioned problems are reduced and thus the wires are suitably formed.

In FIG. 4, each relay wire 23 is formed mainly on the insulation layer 13 on the pad-formed surface of the uppermost first chip 12 of the first block 15. A base end of the each relay wire 23 is connected to the each connection electrode pad P of the first chip 12 and formed so as to be extended over a roughly entire width of the longitudinal direction of the connection electrode pad P. Then, among four sides of the pad-formed surface, at a side opposite to the side having the connection electrode pads P, the relay electrode pad RP connected to the top end of the each relay wire 23 is formed in a roughly same shape as the connection electrode pad P. In other words, on the pad-formed surface of the uppermost first chip 12 of the first block 15 are formed the connection electrode pads P at one of the opposite sides of the pad-formed surface and the relay electrode pads RP at the other side thereof. Additionally, a pair of the connection electrode pad P and the relay electrode pad RP opposing each other are connected by each of the relay wires 23. The relay electrode pads RP are arranged in a longitudinal direction such that longitudinal positions of the pads RP correspond to those of the connection electrode pads P. Thereby, when a semiconductor chip or the like is laminated on the uppermost first chip 12 of the first block 15 in a manner so as to expose the relay electrode pads RP, electrodes of the semiconductor chip laminated thereon can be connected to the relay electrode pads RP. In this manner, the substrate terminals BP are electrically connected to the connection electrode pads P and the relay electrode pads RP, respectively corresponding to the substrate terminals BP on the mutually laminated respective first chips 12.

On the first block 15 is laminated the second block 19 including the second chips 16. The second chips 16 have the same electronic circuits, the same functions, and the same shape as those of the first chips 12. Additionally, similarly to the first chips 12, each of the second chips 16 includes a plurality of connection electrode pads P provided along a side of the pad-formed surface of each chip. The connection electrode pads P are connected to the electronic circuits formed on the each second chip 16 to be assigned for each function of the electronic circuits. On the second chip 16, the connection electrode pads P are arranged such that the order of the respective functions is equivalent to a predetermined order. In the present embodiment, an order of the correction electrode pads P arranged on the each second chip 16 is set such that the order of functions assigned to the correction electrode pads P of the second chip 16 is reversed to that of functions assigned to the correction electrode pads P of the first chip 12. In short, the second chip 16 is a so-called mirror chip of the first chip 12.

The second chip 16 includes an insulation film 18 provided on the electronic circuits. The insulation film 18, which is the same as the insulation layer 13 of the first chip 12, protects the electronic circuits of the second chip 16 and maintains insulation between the electronic circuits and an external conductive member. In the embodiment, the insulation film 18 is formed in a manner so as to expose the connection electrode pads P and thus does not inhibit connection between the connection electrode pads P and external wires, or the like. Also on a lower surface of the second chip 16 is formed a same insulation film (not shown) as the insulation film 18 to maintain insulation between the lower surface thereof and an external conductive member. The second chips 16 thus formed are mutually laminated to form the second block 19.

The second block 19 is, as shown in FIG. 1, formed in a stepped shape by laminating the second chips 16 included in the second block 19 in such a manner that a side of each second chip 16 having the connection electrode pads P is deviated in the back and forth direction (the lateral direction) by the predetermined deviation length ΔL to expose the connection electrode pads P of the each chip 16. In the second block 19, vertically adjacent two of the second chips 16 have the predetermined deviation length ΔL between the two and are bondingly fixed to each other by a bonding layer (not shown) between the insulation film 18 formed on an upper surface of a lower second chip 16 of the adjacent two chips and the insulation film formed on a lower surface of an upper second chip 16 thereof. Accordingly, for example, when each deviation length ΔL is set to 250 micrometers, the longitudinal length of the second block 19 including the laminated six second chips 12 is equivalent to a second block length L12 obtained by adding the longitudinal length CL of a single second chip 16 to a total deviation length of 1250 (250×5) micrometers of remaining five second chips 16 that are mutually laminated while being deviated with respect to each other by the deviation length ΔL. In the embodiment, although the bonding layer has the thickness of 5 to 10 micrometers, the thickness of the bonding layer may alternatively be smaller than 5 micrometers or larger than 10 micrometers.

Between a lower surface of a lowest second chip 16 of the second block 19 and a surface of the uppermost first chip 12 of the first block 15 facing the lower surface of the lower second chip 16 is formed the bonding layer. Thereby, the lower surface of the lowest second chip 16 is bondingly fixed on the surface of the uppermost first chip 12 via the bonding layer. Specifically, the second block 19 is bondingly fixed to the first block 15 in such a manner that the connection electrode pads P of the lowest second chip 16 are arranged along the relay electrode pads RP of the uppermost first chip 12 of the first block 15. In this case, the second block 19 is laminated on the first block 15 in a manner so as to be deviated with respect to the first block 15 by the deviation length ΔL in such a manner that the relay electrode pads RP of the first block 15 are exposed and the connection electrode pads P on the uppermost chip 12 of the first block 15 are covered.

In the above structure, an area occupied by the first block 15 is extended in a single direction (a rightward direction in FIG. 4) from the substrate terminals BP in a planar direction of the mounting surface of the mounting substrate 10. Meanwhile, an area occupied by the second block 19 is further extended to a base end of the first block 15 from a position shifted by the deviation length ΔL from a top end of the first block 15. In other words, on the mounting surface of the mounting substrate 10, the area of the first block 15 roughly overlaps with the area of the second block 19.

In FIGS. 1 and 5, in the second block 19, a stepped difference corresponding to a thickness of each second chip 16 is generated at the side of the each second chip 16 having the connection electrode pads P, and at the stepped difference is formed a slope 25 as an inclined portion.

The slope 25 has a continuous surface mutually connecting pad-formed surfaces of a pair of second chips 16 laminated one on the other in a manner so as to reduce the stepped difference between the pad-formed surfaces. The slope 25 is made of a same insulating resin or the like as in the slope 20 of the each first chip 12. The slope 25 is formed at the side of the each second chip 16 having the connection electrode pads P. Thereby, a route connecting the connection electrode pads P of a lower second chip 16 in the pair to the connection electrode pads P of an upper second chip 16 in the pair is formed in a roughly non-stepped shape by the continuous surface.

In addition, the slope 25 provided on the lowest second chip 16 has a continuous surface connecting the pad-formed surface of the uppermost chip 12 of the first block 15 to the pad-formed surface of the lowest chip 16 of the second block 19 in a manner so as to reduce a stepped difference between the pad-formed surfaces. Thereby, a route connecting the connection electrode pads P of the lowest second chip 16 to the relay electrode pads RP of the uppermost first chip 12 is also formed in a roughly non-stepped shape by the continuous surface. In the embodiment, after the second block 19 is bondingly fixed to the first block 15, the slope 25 is formed by the dispenser method, as in the formation of the slope 20.

Between the relay electrode pads RP of the first block 15 and the connection electrode pads P of the second block 19 are formed a plurality of second wires 27 that are upper wires continuously extended in the lamination direction of the second chips 16. In order to form the second wires 27, using the inkjet method, liquid droplets of the same conductive ink as that of the first wires 21 is placed on the first and the second blocks 15 and 19 mutually laminated. The conductive ink of the embodiment includes the conductive particles of silver and water as the dispersion medium.

Specifically, the second wires 27 connect the relay electrode pads RP of the first block 15 to the correction electrode pads P of the second chips 16 in the lamination direction of the second chips 16. Thereby, each of the second wires 27 is provided between each relay electrode pad RP and each connection electrode pad P of the uppermost second chip 16 in such a manner that the relay electrode pad RP is connected to the connection electrode pad P of the each second chip 16 corresponding to the relay electrode pad RP. In other words, the each second wire 27 connects, first, the each relay electrode pad RP to the corresponding each connection electrode pad P of the lowest second chip 16, and then, connects the each connection electrode pad P of the lowest second chip 16 to the corresponding each connection electrode pad P of the second chip 16 laminated on the lowest second chip 16. Similarly, the second wire 27 mutually connects the corresponding connection electrode pads P of two second chips 16 laminated in a relationship between upper and lower second chips. Then, the connection electrode pads P of the uppermost second chip 16 are connected to the corresponding connection electrode pads P of a second chip 16 laminated under the uppermost second chip 16. Thereby, the relay electrode pads RP are electrically connected to the corresponding connection electrode pads P of each second chip 16 in the lamination direction of the second chips 16. In this case, each of the second wires 27 is a thin metal film formed by the inkjet method, and thus may become thinner or may be disconnected if there is any stepped difference at a point on the route. However, in the embodiment, the slope 25 is formed to eliminate the vertical stepped difference generated at the sides of the second chips 16 having the electrodes, so that occurrences of the above-mentioned problems are reduced and thus the wires can be suitably formed.

Figure 11:
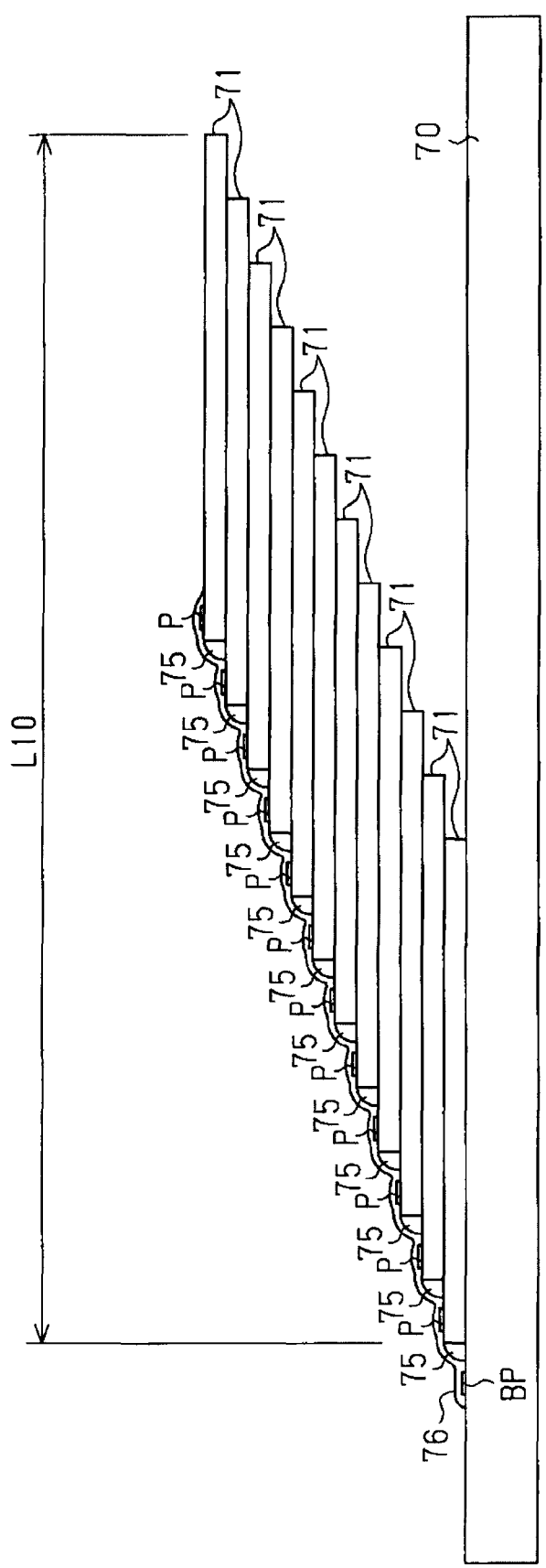
FIG. 11 is a front view showing a frontal structure of a conventional semiconductor device including a plurality of semiconductor chips laminated in a stepped shape in a single direction.

Consequently, in the semiconductor device 11 of the embodiment, a total length L1 as a longitudinal length of the device 11 is equivalent to a length that is, first, extended by the first block length L11 of the first block 15 in the rightward direction, then shifted from the extended position by the deviation length ΔL in the leftward direction, and further extended from the shifted position by the second block length L12 of the second block 19 in the leftward direction. In short, the first block length L11 extended in the rightward direction is offset by the second block length L12 in the leftward direction while leaving only the deviation length ΔL as it is. As a result, the total length L1 is expressed by L12+ΔL, namely, CL+6×ΔL. In contrast, when 12 semiconductor chips are laminated one on another with the deviation length ΔL to be arranged linearly as in the conventional device, a total length L10 is expressed by CL+12×ΔL, as shown in FIG. 11. Thus, in the embodiment, the longitudinal length of the semiconductor device 11 occupying the mounting substrate 10 is equivalent to the total length L1 and is reduced by the length of 6×ΔL as compared to the conventional device. Accordingly, even when a same number of semiconductor chips are mutually laminated, the embodiment can reduce the length of the semiconductor chips occupying the mounting substrate (a mounting area), so that the semiconductor device 11 of the embodiment allows lamination of many more semiconductor chips on a limited area, as compared to conventional semiconductor devices.

As described hereinabove, the semiconductor device 11 of the embodiment provides advantageous effects as below:

1. On the pad-formed surface of the connection chip 12a, the relay electrode pads RP connected to the connection electrode pads P of the second chip 16 laminated on the chip 12a are exposed from the second chip 16 in a direction distant from the mounting terminals BP. Then, the relay electrode pads RP of the connection chip 12a is electrically connected to the connection electrode pads P of the second chip 16 laminated on the connection chip 12a by the wires. Thereby, in accordance with positions of the connection electrode pads P and the relay electrode pads RP of the connection chip 12a relatively changed by 180 degrees with respect to the uppermost first chip 12 as the connection chip 12a, positions of the connection electrode pads P of the second chip 16 as the uppermost first chip 12a and the substrate terminals BP of the mounting substrate 10 are relatively displaced by 180 degrees in the planar direction of the mounting surface. In other words, positions of the first chip 12 and the second chip 16 laminated in a relationship between upper and lower chips are relatively displaced in the planar direction of the mounting substrate in accordance with the relative positions of the connection electrode pads P and the relay electrode pads RP. This can increase flexibility in the lamination manner of the semiconductor chips 12 and 16 in the chip laminate 11. Accordingly, regardless of a structural restriction in which the connection electrode pads P of the semiconductor chips 12 and 16 are connected by the wires, a size of the chip laminate 11 including the semiconductor chips can be reduced in the planar direction of the mounting surface by displacement of the positions of the upper semiconductor chips in the planar direction of the mounting surface. Therefore, since the embodiment can change the lamination manner of the semiconductor chips, the embodiment allows a plurality of semiconductor chips to be mounted even on a mounting substrate where an area for semiconductor chips is limited due to standards or the like.

2. The first block 15 as a laminate including the first chips 12 and the second block 19 as a laminate including the second chips 16 are laminated one on the other as each block unit. Thereby, for example, when viewed from a normal direction of the mounting surface, even in a lamination structure in which the lower wires formed in the first block 15 are covered with the second block 19, a plurality of semiconductor chips can be mounted to easily obtain the semiconductor device as described above.

3. The first and the second chips 12 and 16 are mutually laminated in the manner so as to expose the connection electrode pads P, whereby the stepped difference are generated between the upper and the lower pad-formed surfaces of the chips, as well as the slopes 20 and 25 are formed on the stepped difference. The slopes 20 and 25 reduce the stepped difference, and the upper wires and the lower wires, respectively, are formed on the slopes 20 and 25, respectively. Accordingly, even when the upper and the lower wires are made of a metal film, mechanical stress acting on the wires is reduced. Thus, the embodiment uses the upper and the lower wires made of a metal film, thereby allowing miniaturization of the semiconductor device as a whole.

4. The first and the second chips 12 and 16 are mutually laminated while exposing the connection electrode pads P. Thereby, for example, when the respective semiconductor chips have a same size, the semiconductor chips are laminated in a stepped shape, and as a result, a space is generated below upper semiconductor chips of the laminate. Accordingly, in the embodiment, the inkjet method is used to form the relay wires so as to prevent that mechanical stress from above is applied on the upper first chips 12 of the first block 15 and on the upper second chips 16 of the second block 19, respectively, where the space is generated below. Thereby, even in a condition where the semiconductor chip having the relay electrode pads is laminated, the relay wires can be formed, and eventually, formation of the lower wires and the relay wires can be continuously performed.

Second Embodiment

Hereinafter, a semiconductor device according to a second embodiment of the invention will be described with reference to FIGS. 6A and 6B and FIGS. 7A and 7B. FIGS. 6A and 6B are plan views each showing a partial planar structure of the semiconductor device of the second embodiment. In FIG. 6A, each of a plurality of semiconductor chips is laminated by being deviated with respect to a chip laminated under the each chip in a single direction. In FIG. 6B, wires are formed on the semiconductor chips laminated in FIG. 6A. Similarly, FIGS. 7A and 7B are plan views each showing a partial planar structure of the semiconductor device of the second embodiment. In FIG. 7A, an insulation layer is formed on the wires formed in FIG. 6A, and in FIG. 7B, additional wires are formed on the insulation layer formed in FIG. 7A. In the description of the second embodiment below, same members as those in the first embodiment will be given same reference numerals and thus descriptions thereof will be omitted.

As shown in FIGS. 6A and 6B, the semiconductor chips included in the first block 15 are mutually laminated, similarly to the first embodiment, in such a manner that the connection electrode pads P are closer to the substrate terminals BP than is the insulation layer 13. Additionally, the semiconductor chips included in the not-shown second block 19 are also mutually laminated, similarly to the first embodiment, in such a manner that the connection electrode pads P is more distant from the substrate terminals BP than is the insulation layer 13. Also similarly to the first embodiment, in the laminate of the first and the second blocks 15 and 19, the lamination direction of the first block 15 is reversed to that of the second block 19 when viewed from the normal direction of the mounting surface.

In the semiconductor device of the second embodiment thus formed, an order of functions assigned to an arrangement of the respective connection electrode pads P of the first chip 12 is set to be reversed to that of functions assigned to an arrangement of the respective connection electrode pads P of the second chip 16. In short, the second embodiment is different from the first embodiment where the order of functions assigned to the respective connection electrode pads P arranged on the second chip 16 is reversed to that of functions assigned to the connection electrode pads P arranged on the first chip pad 12.

In the semiconductor device thus structured, the order of the functions assigned to the arrangement of the respective connection electrode pads P in the first block 15 is reversed to that of the functions assigned to the arrangement of the respective connection electrode pads P in the second block 19 in the transverse direction (in a direction from a lower side to an upper side in FIGS. 6A and 6B). Accordingly, in the second embodiment, in order to execute the functions assigned to the respective connection electrode pads P of the first and the second blocks 15 and 19, relay wires connecting the first block 15 to the second block 19 are formed in a manner described below. Except for the above-described point, the second embodiment is the same as the first embodiment. Accordingly, hereinbelow, a description of the relay wires will be given and descriptions of other parts will be omitted for convenience.

In FIG. 6A, in the first block 15 fixed onto the mounting substrate, the substrate terminals BP on the surface of the substrate are electrically connected to the corresponding connection electrode pads P of the each first chip 12 by wires 31, as shown in FIG. 6B. The wires 31 are formed by discharging the same conductive ink as that of the first wires 21 in the first embodiment by the inkjet method.

Each wire 31 has a main wire linearly connecting each substrate terminal BP to each corresponding connection electrode pad P and a relay wire connecting the each connection electrode pad P to each relay electrode pad RP positioned diagonally to the connection electrode pad P on the surface of the uppermost first chip 12. As shown in FIGS. 6A and 6B and FIGS. 7A and 7B, the relay wires connecting the connection electrode pads P to the relay electrode pads RP have a multi-layered wire structure (a multilayered structure of the wires) formed by connecting a lower wired portion formed on the insulation layer 13 to an upper wired portion formed on the insulation layer 30. The insulation layer 30 is made of an insulating material as an insulation layer-forming material, similarly to the insulation layer 13, such as one or a combination of at least two of polymethyl methacrylate, polyvinyl phenol, polyimide, polystyrene, polyvinyl alcohol, and polyvinyl acetate.

Next, the structure of the above-described wires 31 will be described in detail in association with the positions of the connection electrode pads P and the positions of the relay electrode pads RP of the first chip 12. In the description below, in each of FIGS. 6A to 7B, the connection electrode pad P located on a top side is referred to as a first connection electrode pad P, and remaining connection electrode pads P are referred to as a second, a third to an eighth connection electrode pad P sequentially in a downward direction from the first connection electrode pad P. In addition, in each of the drawings, the relay electrode pad RP on the top side is referred to as a first relay electrode pad RP, and remaining relay electrode pads RP are referred to as a second, a third to an eighth relay electrode pad RP sequentially in the downward direction from the first relay electrode pad RP, as well as the wire 31 located on the top side is referred to as a first wire 31, and remaining wires 31 are referred to as a second, a third to an eighth wire 31 sequentially in the downward direction from the first wire 31.

The first wire 31 passes the each first connection electrode pad P from the substrate terminal BP and then is extended to a predetermined point on the insulation layer 13 from the first connection electrode pad P to thereby form a base end portion W11 of the relay wire on the insulation layer 13. The relay wire of the first wire 31 has an L-shaped connection line W13 (a thick line shown in FIG. 7B) extended from the base end portion W11 onto the insulation layer 30 through a communication hole H11 provided in the insulation layer 30, and a top end portion W12 of the connection line W13 is connected to the eighth relay electrode pad RP.

The second wire 31 passes the each second connection electrode pad P from the substrate terminal BP and then is extended to a predetermined point on the insulation layer 13 from the second connection electrode pad P to thereby form a base end portion W21 of the relay wire on the insulation layer 13. The relay wire of the second wire 31 has an L-shaped connection line W23 (a thick line shown in FIG. 7B) extended from the base end portion W21 onto the insulation layer 30 through a communication hole H21 provided in the insulation layer 30, and a top end portion W22 of the connection line W23 is connected to the seventh relay electrode pad RP.

The third wire 31 passes the each third connection electrode pad P from the substrate terminal BP and then is extended to a predetermined point on the insulation layer 13 from the second connection electrode pad P to thereby form a base end portion W31 of the relay wire on the insulation layer 13. The relay wire of the third wire 31 has an L-shaped connection line W33 (a thick line shown in FIG. 7B) extended from the base end portion W31 onto the insulation layer 30 through a communication hole H31 provided in the insulation layer 30, and a top end portion W32 of the connection line W33 is connected to the sixth relay electrode pad RP.

The fourth wire 31 passes the each fourth connection electrode pad P from the substrate terminal BP and then is extended to a predetermined point on the insulation layer 13 from the fourth connection electrode pad P to thereby form a base end portion W41 of the relay wire on the insulation layer 13. The relay wire of the fourth wire 31 has an L-shaped connection line W43 (a thick line shown in FIG. 7B) extended from the base end portion W41 onto the insulation layer 30 through a communication hole H41 provided in the insulation layer 30, and a top end portion W42 of the connection line W43 is connected to the fifth relay electrode pad RP.

The fifth wire 31 passes the each fifth connection electrode pad P from the substrate terminal BP and then extended onto the insulation layer 13 from the fifth connection electrode pad P to thereby form a crank-shaped connection line W5. The connection line W5 of the fifth wire 31 is the relay wire of the fifth wire 31, and a top end portion of the connection line W5 is connected to the fourth relay electrode pad RP.

The sixth wire 31 passes the each sixth connection electrode pad P from the substrate terminal BP and then is extended to a predetermined point on the insulation layer 13 from the sixth connection electrode pad P to thereby form a base end portion W61 of a relay wire having an inverted L-shape on the insulation layer 13. The relay wire of the sixth wire 31 has a linear connection line W63 (a thick line shown in FIG. 7B) extended from the base end portion W61 onto the insulation layer 30 through a communication hole H61 provided in the insulation layer 30, and also has a top end portion W62 extended from the connection line W63 onto the insulation layer 13 through a communication hole H62 provided in the insulation layer 30. The top end portion W62 is connected to the third relay electrode pad RP.

The seventh wire 31 passes the each seventh connection electrode pad P from the substrate terminal BP and then is extended to a predetermined point on the insulation layer 13 from the seventh connection electrode pad P to thereby form a base end portion W71 of a relay wire having an inverted L-shape on the insulation layer 13. The relay wire of the seventh wire 31 has a linear connection line W73 (a thick line shown in FIG. 7B) extended from the base end portion W71 onto the insulation layer 30 through a communication hole H71 provided in the insulation layer 30, and also has a top end portion W72 extended from the connection line W73 onto the insulation layer 13 through a communication hole H72 provided in the insulation layer 30. The top end portion W72 is connected to the second relay electrode pad RP.

The eighth wire 31 passes the each eighth connection electrode pad P from the substrate terminal BP and then is extended to a predetermined point on the insulation layer 13 from the eighth connection electrode pad P to thereby form a base end portion W81 of a relay wire having an inverted L-shape on the insulation layer 13. The relay wire of the eighth wire 31 has a linear connection line W83 (a thick line shown in FIG. 7B) extended from the base end portion W81 onto the insulation layer 30 through a communication hole H81 provided in the insulation layer 30, and also has a top end portion W82 extended from the connection line W83 onto the insulation layer 13 through a communication hole H82 provided in the insulation layer 30. The top end portion W82 is connected to the first relay electrode pad RP.

In the structure described above, the order of functions assigned to the arrangement of the connection electrode pads P of the first block 15 is reversed to the order of functions assigned to the relay electrode pads RP of the first block 15 in the transverse direction. Accordingly, even when the order of functions assigned to the arrangement of the connection electrode pads P is reversed between the first block 15 and the second block 19, the connection electrode pads P belonging to a group having same functions in the first and the second blocks 15 and 19 are connected by an electrically common wire. Thereby, the semiconductor device thus structured obtains a same electrical connection result as in the structure of the first chips 12 consecutively laminated in a single direction. Furthermore, when viewed from the normal direction of the mounting surface, the lamination direction of the second block 19 is reversed to that of the first block 15, so that the area occupied by the semiconductor chips is reduced in the planar direction of the mounting surface in lamination of a same number of semiconductor chips in both blocks.

For example, the wires 31 thus formed are provided by the inkjet method on each of the laminated first chips. Specifically, first, the inkjet method applies the ink on each of the substrate terminals BP, each of the connection electrode pads P, and the insulation layer 13 to form the base end portions W11 to W81 such that the portions W11 to W81 as lower wires are connected to the corresponding substrate terminals BP, as well as to form the top end portions W12 to W82 and the corresponding relay electrode pads RP such that the portions W12 to W82 are connected to the corresponding pads RP. Additionally, the connection line W5 as a lower wire is also formed so as to be connected to the corresponding substrate terminal BP and also connected to the corresponding relay electrode pad RP. Next, the insulation layer 30 is formed by the inkjet method in a manner so as to cover the lower wires. Finally, using the inkjet method, similarly the ink is applied on the insulation layer 30 to form the connection lines W13 to W83 as upper wires.

As described hereinabove, the semiconductor device of the embodiment can provide following advantageous effects in addition to the effects described in 1 to 4 above:

5. The relay wires are formed into the multilayered structure via the insulation layer 30, whereby the relay wires of the respective wires forming the first to the eighth wires 31 and intersecting with each other on the pad-formed surface are insulated by the insulation layer 30. The structure increases flexibility of an arrangement of the relay electrode pads RP and flexibility of a shape of the relay wires, thereby increasing flexibility of the arrangement of the semiconductor chips connected to the relay electrode pads RP. Consequently, the lamination of a plurality of semiconductor chips can be achieved more flexibly.

6. The insulation layer 30 is formed by the inkjet method. Thereby, even after forming the relay wires on the first chip 12, the insulation layer 30 can be formed without any stress to the first chip 12. As a result, thinner semiconductor chips can be used, as well as the arrangement of the semiconductor chips can be made more flexibly.

Third Embodiment

Figure 8A:
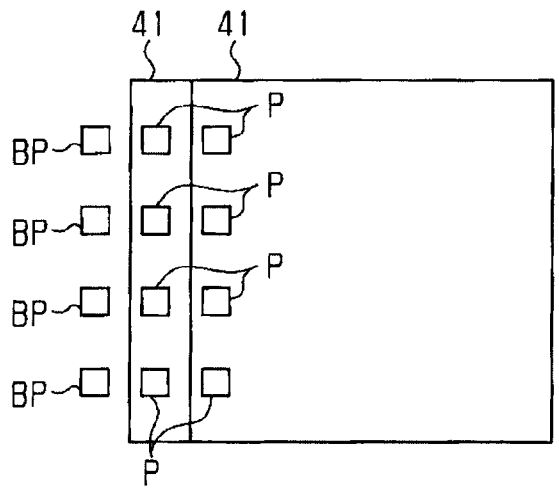
FIG. 8A is a plan view showing a plurality of semiconductor chips laminated on a mounting substrate in a stepped shape in a semiconductor device according to a third embodiment of the invention.
Figure 8B:
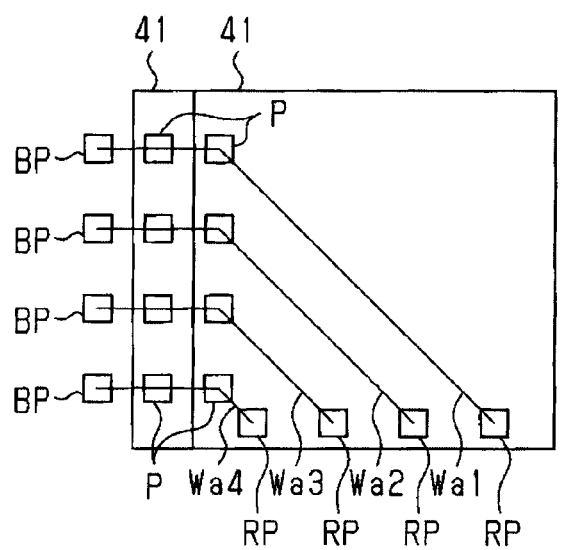
FIG. 8B is a plan view showing wires formed on the semiconductor chips of FIG. 8A.
Figure 8C:
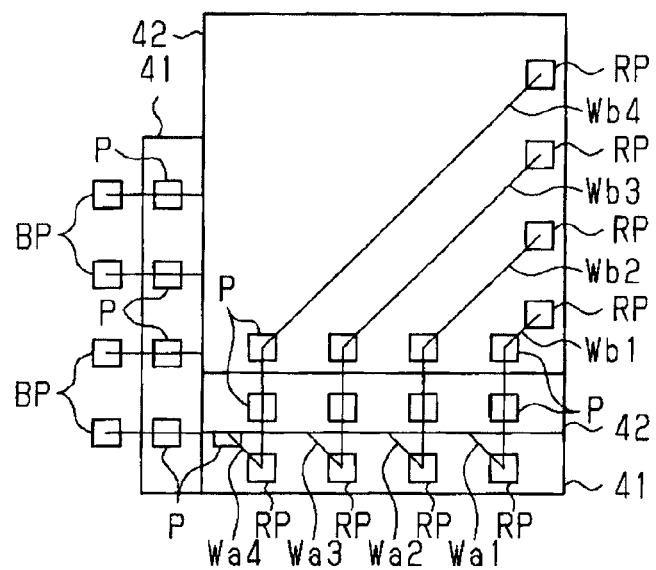
FIG. 8C is a plan view showing semiconductor chips rotated by 90 degrees counterclockwise to be laminated in a stepped shape on the laminate of the semiconductor chips shown in FIG. 8C.

Hereinafter, a semiconductor device according to a third embodiment of the invention will be described with reference to FIGS. 8A, 8B, and 8C. FIGS. 8A to 8C are plan views each showing a planar structure of the semiconductor device of the third embodiment formed by mutually laminating a plurality of semiconductor chips. In FIG. 8A, an upper chip of two semiconductor chips laminated one on the other is deviated with respect to a lower chip thereof in a single direction. In FIG. 8B, wires are formed on the laminated semiconductor chips shown in FIG. 8A, and in FIG. 8C, other semiconductor chips are laminated on the laminate of the semiconductor chips shown in FIG. 8B.

In the third embodiment also, the same reference numerals will be given to the same members as those in the first embodiment, and thus descriptions thereof will be omitted. In addition, the third embodiment is the same as the first embodiment excepting that relative positions of the connection electrode pads P between the upper and the lower semiconductor chips are different from those in the first embodiment. Thus, the different point will be described in detail below and descriptions of other points will be omitted for sake of convenience.

As shown in FIG. 8A, on the mounting surface of the mounting substrate, a pair of upper and lower semiconductor chips (third chips 41) are mutually laminated with a predetermined amount of deviation in such a manner that the respective connection electrode pads P are arranged along the substrate terminals BP, similarly to the first embodiment. The pair of third chips 41 forms a first block. Additionally, at a side of each third chip 41 having the connection electrode pads P, there is formed a same slope as that in the first embodiment, although it is not shown in the drawings.

In FIG. 8B, among four sides of a pad-formed surface of the upper third chip 41, on a side along the arranged connection electrode pads P and a side orthogonal to the side (a lower side of the four sides thereof in the drawings) are arranged a plurality of relay electrode pads RP at a same interval as in the connection electrode pads P. In the description below, in FIG. 8B, uppermost connection electrode pads P are referred to as first connection electrode pads P, and remaining connection electrode pads P are referred to as second, third, and fourth connection electrode pads P sequentially in the downward direction from the first connection electrode pads P. Additionally, in FIG. 8B, a rightmost relay electrode pad RP is referred to as a first relay electrode pad RP, and remaining relay electrode pads RP are referred to as a second, a third, and a fourth relay electrode pad RP, sequentially in a leftward direction from the first relay electrode pad RP.

As shown in FIG. 8B, the first relay electrode pad RP is connected to the first connection electrode pad P by a relay wire Wa1 extended in a diagonal direction of the pad-formed surface, and the second relay electrode pad RP is connected to the second connection electrode pad P by a relay wire Wa1 extended in the diagonal direction of the pad-formed surface. Additionally, the third and the fourth relay electrode pads RP, respectively, are connected to the third and the fourth connection electrode pads P, respectively, by a relay wire Wa3 and a relay wire Wa4, respectively, extended in the diagonal direction of the pad-formed surface.

As shown in FIG. 8C, on an upper surface of the first block, a pair of upper and lower semiconductor chips (fourth chips 42) is laminated with a predetermined amount of deviation in such a manner that the connection electrode pads P are arranged along the relay electrode pads RP of the first block. The fourth chips 42 each are a mirror chip of the third chip 41, and the order of functions assigned to an arrangement of the connection electrode pads P on the fourth chip 42 is reversed to the order of functions assigned to an arrangement of the connection electrode pads P on the third chip 41. The pair of fourth chips 42 forms a second block. Additionally, similarly to the first embodiment, there is formed a slope on a side of each of the fourth chips 42 where the connection electrode pads P are arranged, although the slope is not shown in the drawings.

Specifically, the second block 19 including the pair of mirror chips is equivalent to a structure in which the first block 15 is rotated by 90 degrees counterclockwise along the planar direction of the mounting surface. The second block 19 is laminated on the first block 15 in a manner so as to expose the relay electrode pads RP. In this case, the connection electrode pads P belonging to a group having same functions in the first and the second blocks 15 and 19 are connected by an electrically common wire. Accordingly, in the semiconductor device thus structured, there is obtained a same electrical connection result as in the structure in which the first chips 12 are consecutively laminated in a single direction. Furthermore, when viewed from the normal direction of the mounting surface, the lamination direction of the second block 19 is rotated counterclockwise with respect to that of the first block 15, so that the area occupied by the semiconductor chips is reduced in the planar direction of the mounting surface in lamination of a same number of semiconductor chips in the blocks.

Furthermore, in FIG. 8C, if additional relay electrode pads RP are formed on an uppermost layer of the second block 19 to be connected to the connection electrode pads P by relay wires Wb1 to Wb4, there can be laminated, on the second block, another block that corresponds to a relationship between the first and the second blocks. In the third embodiment also, the relay wires Wa1 to Wa4 and Wb1 to Wb4 are formed by the inkjet method using the same conductive ink as that of the first wires 21 in the first embodiment.

As described hereinabove, the semiconductor device of the embodiment can provide following advantageous effects in addition to the effects described in 1 to 6 above:

7. On the first block including the third chips 41, there is laminated the second block including the pair of mirror chips (the fourth chips 42) equivalent to the third chips 41 rotated by 90 degrees counterclockwise in the planar direction of the mounting surface, in a manner so as to expose the relay electrode pads RP. Thereby, the second block can be laminated on the first block even at 90 degrees with respect to the first block. Specifically, on the third chip 41 positioned under the fourth chip 42, when an angle between the relative positions of the connection electrode pads P and the relay electrode pads RP are 90 degrees, the relative positions of the connection electrode pads P of the fourth chip 42 as the upper layer of the third chip 41 and the substrate terminals BP of the mounting substrate 10 is displaced by 90 degrees in the planar direction of the mounting surface. In other words, in this case also, the relative positions of the third chip 41 as the lower chip and the fourth chip 42 as the upper chip are displaced in the planar direction of the mounting surface in accordance with the relative positions of the connection electrode pads P and the relay electrode pads RP. Accordingly, in the chip laminate, the respective semiconductor chips 41 and 42 can be laminated in a more flexible manner. Thus, although there is a structural restriction in which the connection electrode pads of the respective semiconductor chips are connected by the wires, the upper semiconductor chip can be displaced in the planar direction of the mounting surface, so that a size of the chip laminate including the semiconductor chips can be reduced in the planar direction of the mounting surface. Consequently, since the lamination manner of the semiconductor chips can be changed, many more semiconductor chips can be mounted even on a mounting substrate where an area for the semiconductor chips is limited due to standards or the like.

Meanwhile, each of the above embodiments may be changed as below.

Although the mounting substrate 10 in the each embodiment is the flexible substrate having flexibility, a rigid substrate having inflexibility and rigidity may be used as the mounting substrate 10. In this case, the base material of the substrate made of an insulating base material may be glass as a low-temperature firing base material, ceramic as an inorganic material, a high-temperature firing base material, a high thermal conductive base material (such as silicon carbide), a dielectric material, a resistor material, or the like. Those materials can increase flexibility in options for the mounting substrate 10, thereby increasing application purposes for the semiconductor device thus structured.

In the each embodiment, although the substrate terminals BP are made of a conductive metal, it is merely an example of the terminals BP. For example, the substrate terminals BP may be made of a conductive non-metal material, such as an electron-conductive high polymer (e.g. indium tin oxide or polyaniline).

In the each embodiment, the substrate terminals BP and the connection electrode pads P are formed by the inkjet method. Instead of the method, for example, the substrate terminals BP may be formed by any other known method such as photo-etching. Thereby, regardless of the method for forming the substrate terminals arranged on the substrate, the semiconductor device as described above can be mounted on the substrate.

In the each embodiment, the relay electrode pads RP are formed integrally with the respective wires by the inkjet method. However, alternatively, the relay electrode pads RP may be independently formed, thereby increasing flexibility in the relay electrode forming method.

In the each embodiment, each slope is formed after laminating the semiconductor chips on the mounting substrate. Instead of that, the slope may be formed per block before bondingly fixing the lowest semiconductor chip to the substrate. Then, after lamination of the semiconductor chips on the mounting substrate, the slope needs to be formed only between the mounting substrate and the lowest semiconductor chip and between the blocks including the semiconductor chips. Consequently, since the number of slopes to be formed is reduced, time for mounting each block is also reduced, thereby improving a throughput of such a product including the laminated chips.

In the each embodiment, the each slope is formed by the dispenser method. However, alternatively, any other known method such as the inkjet method may be used to form the slopes.

In the second embodiment, the insulation layer 30 is formed by the inkjet method, but alternatively, may be formed by laminating an insulation member having a through-hole therewith, such as a flexible substrate. This can increase flexibility in formation of the insulation layer, as well as can reduce time for mounting the semiconductor chips by a length of time for forming the insulation layer.

In the second embodiment, the insulation layer 13 is formed on a roughly entire part of the pad-formed surface. Instead of that, the insulation layer 13 may be formed only on a necessary part thereof, such as only on a relay wire-formed region and its neighboring parts. This can reduce time for forming the insulation layer. Similarly, in the second embodiment, the insulation layer 30 is also formed on the roughly entire part of the pad-formed surface, but instead, may be also formed only on a necessary part thereof so as to reduce time for forming the insulation layer.

In the each embodiment, the inkjet method is used to form the insulation layer 13. However, any other known method may be used for the formation of the insulation layer 13, such as spin coating or a dispenser method, thereby increasing options for the method for forming the insulation layer. Similarly, in the second embodiment, the inkjet method is formed to form the insulation layer 30, but any other known method such as spin coating or a dispenser method may be used as long as a through-hole can be formed. This can provide more options for the method for forming the insulation layer.

Figure 9A:
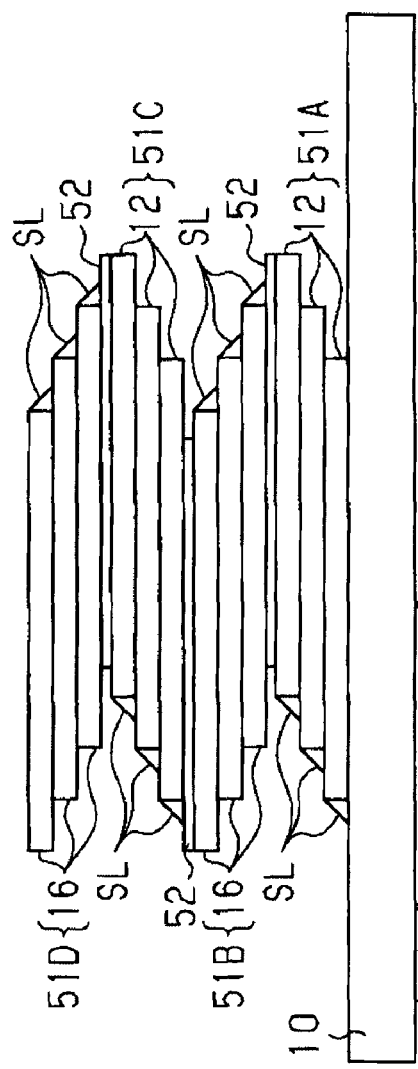
FIG. 9A is a front view of a semiconductor device according to a modification of the above embodiments of the invention.

In the each embodiment, all or a part of the relay wires are formed on the insulation layer 13. Instead of that, the relay wires may be formed on an insulation member or the like bondingly fixed on the pad-formed surface of the semiconductor chip. For example, as shown in FIG. 9A, an insulation substrate 52 as the insulation member may be provided among blocks 51A, 51B, 51C, and 51D to form relay wires.

The structure increases insulation between the electronic circuits and the relay wires on the semiconductor chips.

In the each embodiment, each relay wire is formed of a single layer or double layers. Instead of that, the relay wires may be formed of three or more layers. This can increase options for wiring routes of the relay wires, thereby obtaining a complicate route. Consequently, an application range for such relay wires can be extended.

In the each embodiment, the semiconductor chip having the relay electrode pads RP is the semiconductor substrate. However, a combination of any other kind of substrates may be used for the semiconductor chip as long as the chip includes a semiconductor substrate. For example, the semiconductor chip may be a combination of a semiconductor substrate and another kind of substrate such as a glass substrate or a ceramic substrate. This can increase options for the semiconductor chip.

Figure 9B:
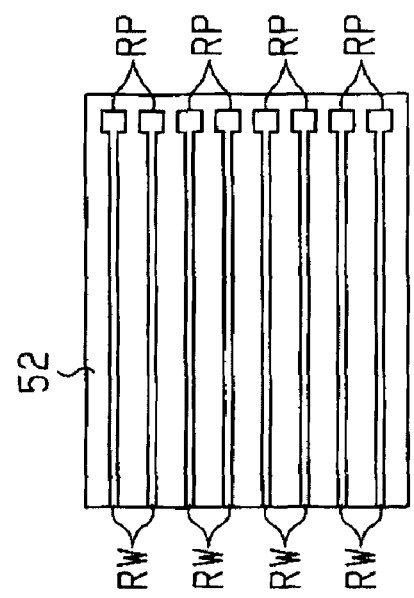
FIG. 9B is a plan view showing an example of an insulation layer included in the semiconductor device of FIG. 9A.

In the each embodiment, the relay wires are formed on the pad-formed surface of the first chip 12 and the like. However, at least a part of the relay wires or relay electrodes may be formed on a substrate or the like in advance, and the substrate or the like may be used for at least a part of the relay wires or the relay electrode pads. For example, as shown in FIG. 9B, when laminating the blocks 51A, 51B, 51C, and 51D, the insulation substrate 52 may be provided between the blocks, as a relay substrate where relay wires RW and relay electrode pads RP are formed in advance. In this case, an end portion of each relay wire RW opposite to each relay electrode pad RP may be connected, as a connection electrode pad to each connection electrode pad P of a lower layer, whereas the each relay electrode pad RP may be connected to each connection electrode pad P of an upper layer. In the structure and the method described above, time for forming the relay wires and the relay electrode pads is reduced and the method for forming the relay wires and the relay electrode pads is simplified, as compared to formation of the relay wires and the relay electrode pads on a semiconductor chip laminate. Thus, production of the above-described semiconductor device can be achieved with high flexibility.

In the above structure, as long as the insulation substrate 52 has insulation properties, the substrate 52 may be a semiconductor substrate, a glass substrate, a ceramic substrate, or another kind of substrate having insulation properties. Thereby, for the semiconductor device, a suitable insulation substrate can be selected.

In the each embodiment, the lamination direction of the semiconductor chips is changed only once, but, instead, may be changed a plurality of times. For example, as shown in FIG. 9A, there may be formed a plurality of blocks 51A and 51C each including the first chips 12 and a plurality of blocks 51B and 51D each including the second chips 16. Then, the respective blocks 51A, 51B, 51C, and 51D may be alternately laminated one on another in such a manner that the lamination directions of the semiconductor chips in the respective blocks are alternately reversed when viewed from the normal direction of the mounting surface. In this manner, an amount of deviation per the semiconductor chip is offset by the mutually opposing lamination directions, whereby the area for the semiconductor chips is reduced in the planar direction of the mounting surface.

In the first embodiment, the chip laminate 11 is formed by laminating the second block 19 on the first block 15. However, this is merely an example of the structure of the chip laminate 11. The chip laminate 11 can be structured in any configuration as long as the laminate 11 is formed by laminating at least one first chip at least once and then laminating at least one second chip at least once on the at least one first chip. The structure thus formed can provide same advantageous effects as the above-described effects.

In the first embodiment, the chip laminate 11 is formed by laminating the second block 19 on the first block 15 after fixing the first block 15 on the mounting substrate 10. However, there are other methods for forming the chip laminate 11. For example, a laminate of blocks, such as the laminate of the first and the second blocks 15 and 19, may be fixed on the mounting substrate to form a chip laminate. Thereby, the chip laminate can be formed more flexibly.

In the first embodiment, after the second block 19 is laminated on the first block 15 fixed on the mounting substrate 10, the second wires 27 are formed to connect the relay electrode pads RP to the connection electrode pads P. However, as an alternative structure, the wires for connecting the relay electrode pads RP to the connection electrode pads P can be formed whenever after laminating the first and the second blocks. For example, on the laminate of the first and the second blocks, there may be formed the relay electrode pads RP and the connection electrode pads P connected by the wires, and then, the laminate may be fixed on the mounting substrate. Thereby, formation of the chip laminate can be achieved more flexibly.

In the each embodiment, the respective semiconductor chips have the rectangular shape. Instead of that, the semiconductor chips may have any other arbitrary shape, such as a polygonal shape other than the rectangular one, or a round or oval shape, for example. In other words, the semiconductor chips may be in any shape as long as the chips can be mutually laminated by being deviated from each other in a stepped form so as to expose the electrodes formed on the pad-formed surfaces. The lamination manner can reduce the area occupied by the semiconductor chips on the mounting substrate.

Figure 10A:
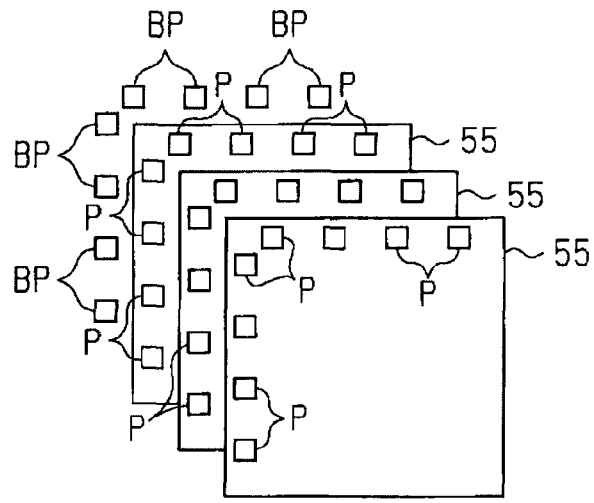
FIG. 10A is a plan view showing a plurality of semiconductor chips having connection electrode pads at two sides of each chip and laminated on a mounting substrate in a stepped shape in a single direction in a semiconductor device according to another modification of the embodiments.
Figure 10B:
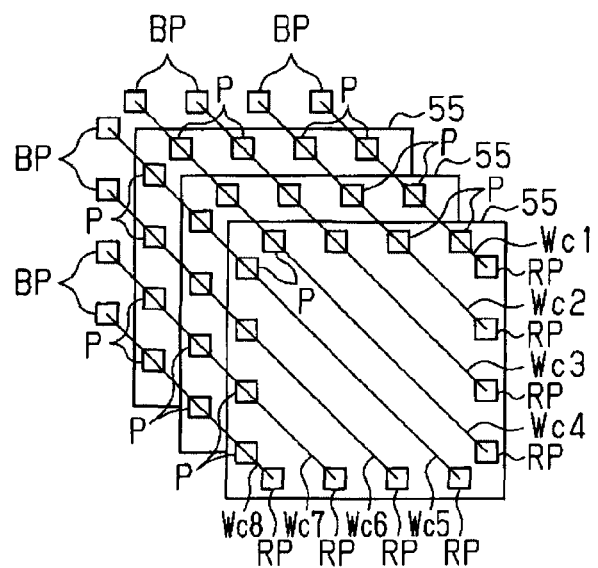
FIG. 10B is a plan view showing wires formed on the semiconductor chips of FIG. 10A.
Figure 10C:
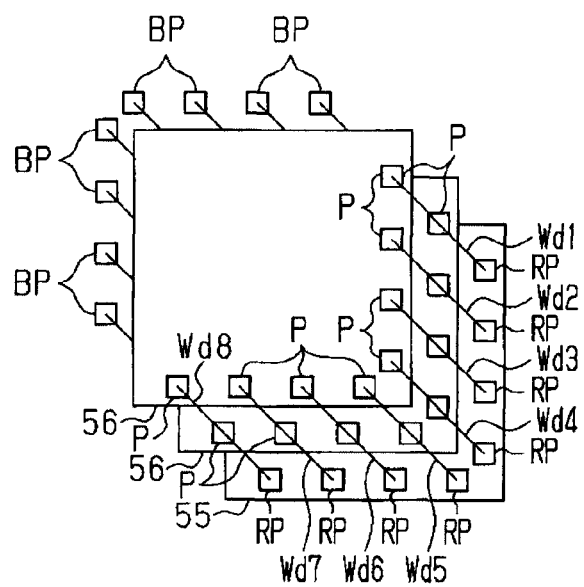
FIG. 10C is a plan view showing semiconductor chips laminated in a stepped shape in a direction opposite to the single direction on the laminate of the semiconductor chips shown in FIG. 10B.

In the each embodiment, the connection electrode pads P are arranged in a single line along one of the four sides of the each pad-formed surface. However, this is merely an example of the arrangement of the connection electrode pads P. Instead of arranging the connection electrode pads P in the single line, the pads P may be arranged in a plurality of lines, or any other arbitrary arrangement may be used for the connection electrode pads P. For example, as shown in FIGS. 10A to 10C, the connection electrode pads P may be arranged along two sides forming a corner angle of the pad-formed surface. In such a structure, as shown in FIG. 10A, respective semiconductor chips 55 are mutually laminated by being deviated from each other in the diagonal direction of the pad-formed surface, whereby the connection electrode pads P arranged along the two sides are exposed. Additionally, as shown in FIG. 10B, on the semiconductor chip 55 as an uppermost layer, relay electrode pads RP are arranged along other sides forming an other corner angle of the pad-formed surface thereof, whereby the connection electrode pads P corresponding to the substrate terminals BP are connected to the relay electrode pads RP by wires Wc1 to Wc8. Then, as shown in FIG. 10C, other semiconductor chips 56 are laminated so as to expose the respective relay electrode pads RP, and respective connection electrode pads P of the other semiconductor chips 56 are connected to the corresponding relay electrode pads RP by wires Wd1 to Wd8. In the above structure, even in the semiconductor chips having the electrodes formed along the sides of the pad-formed surface, the area occupied by the semiconductor chips on the substrate can be reduced as compared to the lamination of semiconductor chips in a single direction.

The entire disclosure of Japanese Patent Application No. 2008-288861, filed Nov. 11, 2008 is expressly incorporated by reference herein.

What is claimed is:

1. A semiconductor device, comprising:
a first semiconductor substrate having a first surface on which a first electrode pad is provided at a first end portion of the first surface;
a second semiconductor substrate having second and third surfaces, the second semiconductor substrate being stacked on the first semiconductor substrate so that the first surface and the second surface face each other, the second semiconductor substrate being shifted in a first direction so as to expose the first electrode pad, a second electrode pad being formed on a second end portion of the third surface and in the vicinity of the first electrode pad, and a third electrode pad being formed on a third end portion of the third surface, the third end portion being opposite to the second end portion; and
a third semiconductor substrate having fourth and fifth surfaces, the third semiconductor substrate being stacked on the second semiconductor substrate so that the third and fourth surfaces face each other, the third semiconductor substrate being shifted in a second direction opposite to the first direction so as to expose the third electrode pad, and a fourth electrode pad being formed on a fourth end portion of the fifth surface and in the vicinity of the third electrode pad, wherein
the first and second electrode pads are electrically connected by a first conductive layer that is formed at the first and second end portions,
the second and third electrode pads are electrically connected by a second conductive layer that is formed between the third and fourth surfaces, and
the third and fourth electrode pads are electrically connected by a third conductive layer that is formed at the third and fourth end portions so that the first through fourth electrode pads are electrically connected to each other by the first through third conductive layers.

2. The semiconductor device, according to claim 1, further comprises:
a first insulating inclined portion that is provided on a side of the second substrate, the first insulating inclined portion having a first continuous surface mutually connecting the first and second end portions in a manner so as to reduce a first stepped difference between the first and second end portions; and
a second insulating inclined portion that is provided on a side of the third substrate, the second insulating inclined portion having a second continuous surface mutually connecting the third and fourth end portions in a manner so as to reduce a second stepped difference between the third and fourth end portions, wherein
the first conductive layer is formed on the first insulating inclined portion, and the third conductive layer is formed on the second insulating inclined portion.

3. The semiconductor device, according to claim 1, wherein the second conductive layer is formed into a multilayered structure via an insulation layer.

4. A method for producing a semiconductor device, comprising:
providing a first semiconductor substrate having a first surface on which a first electrode pad is provided at a first end portion of the first surface;
providing a second semiconductor substrate having second and third surfaces, the second semiconductor substrate being stacked on the first semiconductor substrate so that the first surface and the second surface face each other, the second semiconductor substrate being shifted in a first direction so as to expose the first electrode pad, a second electrode pad being formed on a second end portion of the third surface and in the vicinity of the first electrode pad, and a third electrode pad being formed on a third end portion of the third surface, the third end portion being opposite to the second end portion;
providing a third semiconductor substrate having fourth and fifth surfaces, the third semiconductor substrate being stacked on the second semiconductor substrate so that the third and fourth surfaces face each other, the third semiconductor substrate being shifted in a second direction opposite to the first direction so as to expose the third electrode pad, and a fourth electrode pad being formed on a fourth end portion of the fifth surface and in the vicinity of the third electrode pad;
forming a first conductive layer at the first and second end portions to electrically connect between the first and second electrode;
forming a second conductive layer between the third and fourth surfaces to electrically connect between the second and third electrode pads; and
forming a third conductive layer at the third and fourth end portions to electrically connect between the third and fourth electrode pads, wherein
the first through fourth electrode pads are electrically connected to each other by the first through third conductive layers.

5. The method for providing a semiconductor device, according to claim 4, further comprises:
providing a first insulating inclined portion on a side of the second substrate, the first insulating inclined portion having a first continuous surface mutually connecting the first and second end portions in a manner so as to reduce a first stepped difference between the first and second end portions; and
providing a second insulating inclined portion on a side of the third substrate, the second insulating inclined portion having a second continuous surface mutually connecting the third and fourth end portions in a manner so as to reduce a second stepped difference between the third and fourth end portions, wherein
the first conductive layer is formed on the first insulating inclined portion, and the third conductive layer is formed on the second insulating inclined portion.

6. The method for providing a semiconductor device, according to claim 4, wherein the second conductive layer is formed by discharging conductive particle-containing liquid in a manner so as to connect the second and third pads, and then drying the conductive particle-containing liquid.

7. The method for producing a semiconductor device, according to claim 4, wherein the second conductive layer is formed into a multilayered structure via an insulation layer.

8. The method for producing a semiconductor device, according to claim 7, wherein the insulation layer is formed by discharging insulating liquid containing an insulation layer forming material on the third surface, and then drying the insulating liquid.

* * * * *